(12) United States Patent
Battlogg

(10) Patent No.: US 12,276,318 B2
(45) Date of Patent: Apr. 15, 2025

(54) DEVICE COMPONENT HAVING A MAGNETORHEOLOGICAL BRAKE DEVICE

(71) Applicant: INVENTUS Engineering GmbH, St. Anton i.M. (AT)

(72) Inventor: Stefan Battlogg, St. Anton i.M. (AT)

(73) Assignee: INVENTUS Engineering GmbH, St. Anton i.M. (AT)

( * ) Notice: Subject to any disclaimer, the term of this patent is extended or adjusted under 35 U.S.C. 154(b) by 383 days.

(21) Appl. No.: 17/784,739

(22) PCT Filed: Dec. 18, 2020

(86) PCT No.: PCT/EP2020/087179
§ 371 (c)(1),
(2) Date: Jun. 13, 2022

(87) PCT Pub. No.: WO2021/123278
PCT Pub. Date: Jun. 24, 2021

(65) Prior Publication Data
US 2023/0003276 A1    Jan. 5, 2023

(30) Foreign Application Priority Data

Dec. 18, 2019   (DE) ...................... 10 2019 135 026.3

(51) Int. Cl.
*F16F 9/53*         (2006.01)
*F16F 9/00*         (2006.01)
(Continued)

(52) U.S. Cl.
CPC .............. *F16F 9/535* (2013.01); *F16F 9/006* (2013.01); *F16F 2222/06* (2013.01);
(Continued)

(58) Field of Classification Search
CPC ..... F16F 9/535; F16F 2222/06; F16D 35/028; F16D 37/02; F16D 57/02; F16D 67/06; F16D 2037/005
See application file for complete search history.

(56) References Cited

U.S. PATENT DOCUMENTS

| | | |
|---|---|---|
| 6,311,810 B1 | 11/2001 | Hopkins et al. |
| 6,681,905 B2 | 1/2004 | Edmondson et al. |
| | (Continued) | |

FOREIGN PATENT DOCUMENTS

| | | |
|---|---|---|
| CN | 101443572 A | 5/2009 |
| CN | 107111368 A | 8/2017 |
| | (Continued) | |

*Primary Examiner* — Thomas J Williams
(74) *Attorney, Agent, or Firm* — Laurence A. Greenberg; Werner H. Stemer; Ralph E. Locher

(57) ABSTRACT

A device component has a magnetorheological brake device with a static holder and with two brake components. A first brake component is rotationally fixedly to the holder and extends in an axial direction. A second brake component has a hollow, rotary part which is rotatable about the first brake component. An encircling gap between the first and second brake components is filled with a magnetorheological medium. The first brake component has a core of magnetically conductive material which extends in the axial direction. An electrical coil is wound axially around the core and spans a coil plane. A magnetic field of the coil extends transversely through the first brake component. A maximum outer diameter of the electrical coil in a radial direction within the coil plane is greater than a minimum outer diameter of the core in a radial direction transversely to the coil plane.

21 Claims, 6 Drawing Sheets

(51) Int. Cl.
    *G01R 33/00*     (2006.01)
    *G01R 33/07*     (2006.01)
    *G05G 5/03*     (2008.04)

(52) U.S. Cl.
    CPC ...... *F16F 2230/08* (2013.01); *G01R 33/0076* (2013.01); *G01R 33/072* (2013.01); *G05G 5/03* (2013.01)

(56) References Cited

U.S. PATENT DOCUMENTS

| | | | |
|---|---|---|---|
| 9,091,309 | B2 | 7/2015 | Battlogg |
| 9,217,487 | B2 | 12/2015 | Battlogg et al. |
| 10,386,929 | B2 | 8/2019 | Eck et al. |
| 10,963,051 | B2 | 3/2021 | Eck et al. |
| 10,976,827 | B2 | 4/2021 | Battlogg |
| 11,266,867 | B2 | 3/2022 | Battlogg |
| 11,280,379 | B2 | 3/2022 | Battlogg |
| 11,300,990 | B2 | 4/2022 | Battlogg |
| 2002/0057152 | A1 | 5/2002 | Elferich et al. |
| 2010/0231069 | A1* | 9/2010 | Liao ............... H02K 1/02 188/267.2 |
| 2011/0128135 | A1 | 6/2011 | Periquet et al. |
| 2012/0085613 | A1 | 4/2012 | Boese et al. |
| 2012/0186921 | A1 | 7/2012 | Battlogg et al. |
| 2012/0211315 | A1 | 8/2012 | Shiao et al. |
| 2012/0272480 | A1* | 11/2012 | Ac ............... E05D 11/082 16/320 |
| 2015/0247548 | A1* | 9/2015 | Battlogg ............... F16F 9/535 188/267.2 |
| 2018/0231093 | A1 | 8/2018 | Hafez et al. |
| 2019/0111300 | A1* | 4/2019 | Battlogg ............... B01D 69/14 |
| 2020/0355229 | A1 | 11/2020 | Battlogg |
| 2023/0003276 | A1* | 1/2023 | Battlogg ............... F16F 9/006 |
| 2023/0241973 | A1* | 8/2023 | Battlogg ............... G05G 5/03 188/267.2 |

FOREIGN PATENT DOCUMENTS

| | | |
|---|---|---|
| CN | 108139765 A | 6/2018 |
| CN | 109073030 A | 12/2018 |
| CN | 110325758 A | 10/2019 |
| DE | 10218320 A1 | 6/2003 |
| DE | 102015104927 A1 | 10/2016 |
| DE | 102018100390 A1 | 7/2019 |
| EP | 1168622 A2 | 1/2002 |
| JP | 2017089730 A | 5/2017 |
| JP | 2017146843 A | 8/2017 |
| JP | 2017173951 A | 9/2017 |
| KR | 20190047930 A | 5/2019 |
| WO | 2010020422 A1 | 2/2010 |
| WO | 2012034697 A1 | 3/2012 |
| WO | 2017001696 A1 | 1/2017 |
| WO | 2019131453 A1 | 7/2019 |
| WO | WO-2021123261 A2 * | 6/2021 ........... F16D 57/002 |

* cited by examiner

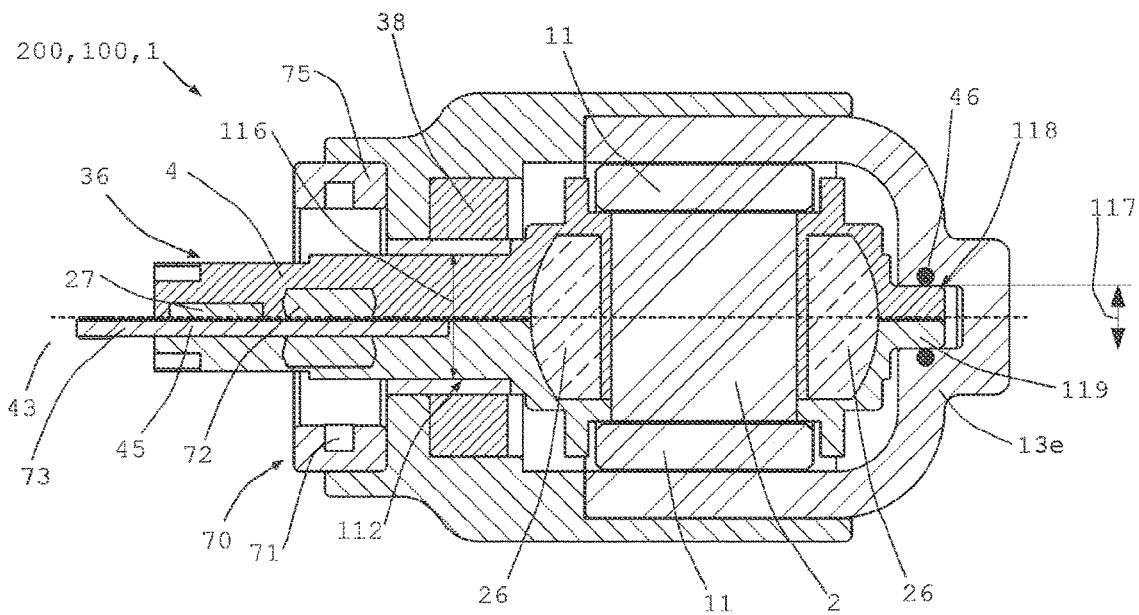
Fig. 6a
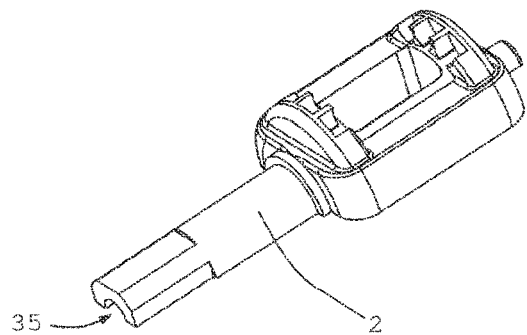
Fig. 6b
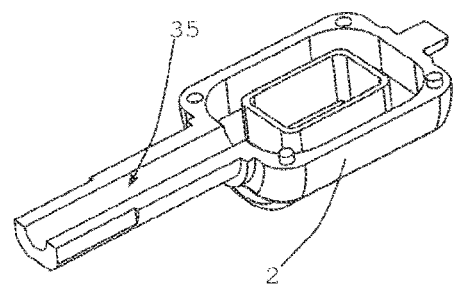
Fig. 6c
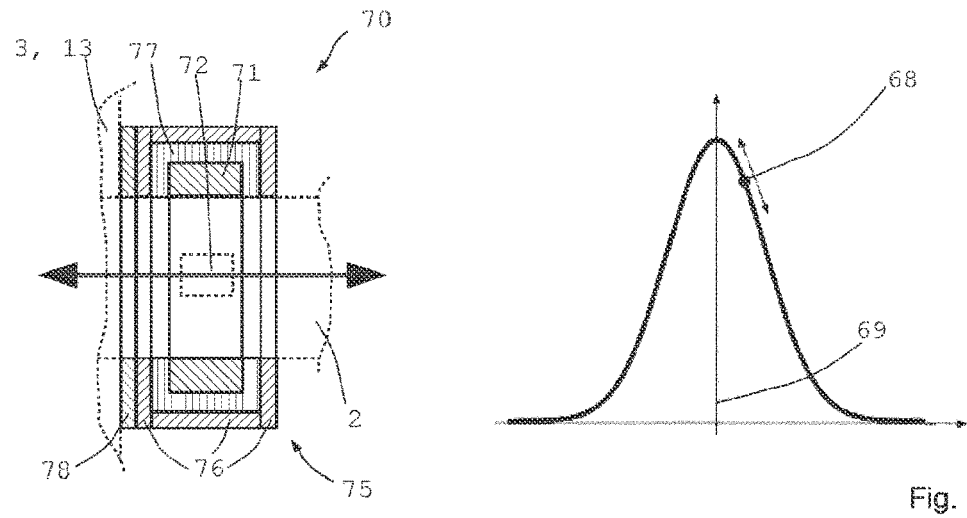
Fig. 6d
Fig. 6e

DEVICE COMPONENT HAVING A MAGNETORHEOLOGICAL BRAKE DEVICE

FIELD AND BACKGROUND OF THE INVENTION

The invention relates to a device component having a magnetorheological brake device having a stationary mount and having at least two brake components. The device component according to the invention having the magnetorheological brake device can be used for braking mutual relative movements in many technical fields, in particular for braking or else decelerating a rotating movement. The device component according to the invention having the magnetorheological brake device can also be used as a haptic operating device and be used, for example, for operating technical devices in vehicles, (as a rotary actuator; a rotate/push actuator; for infotainment, an air conditioning system, transmission gear selectors, navigation, seat adjustment, in the steering system or in the steering wheel, adjustment of vehicle suspension systems, adjustment of driving modes . . . ), motor vehicles, aerospace and aircraft, ships, boats, agricultural machinery (tractors, combine harvesters, harvesters, other agricultural machinery), construction machinery and material handling machinery (forklift trucks . . . ), industrial machine tools and systems, or in medical or industrial systems. The invention can also be used for operating or as an input device of/for washing machines, kitchen/domestic appliances and devices, radios, still and movie cameras, HiFi and TV systems, smart devices, smart domestic devices, laptops, personal computers, smart watches, in a crown gear of wristwatches or as an input device for computers or as a computer mouse or as a rotating wheel in a computer mouse or controllers, game consoles, gaming equipment, rotary button in a keyboard or other devices.

Magnetorheological fluids have minute ferromagnetic particles such as, for example, carbonyl iron powder, distributed in an oil, for example. Spherical particles having a production-related diameter of 1 to 10 μm are used in magnetorheological liquids, wherein the size and shape of the particles is not uniform. When such a magnetorheological fluid is impinged by a magnetic field, the carbonyl iron particles of the magnetorheological fluid form a chain along the magnetic field lines so that the rheological properties of the magnetorheological fluid (MRF) are significantly influenced as a function of the shape and intensity of the magnetic field.

WO 2012/034697 A1 discloses a magnetorheological transmission apparatus which has two couplable components, the coupling intensity of the latter being able to be influenced. A duct having a magnetorheological medium is provided for influencing the coupling intensity. The magnetorheological medium in the duct is influenced by a magnetic field. Rotating members, on which acute regions that contain the magnetorheological medium are provided, are provided in the duct. The duct, or at least part thereof, is able to be impinged with the magnetic field of a magnetic field generator device so as to selectively interlink the particles, and to wedge them to the rotating member, or release said particles. This magnetorheological transmission apparatus can also be used on a rotary button for operating technical equipment. Such a magnetorheological transmission apparatus functions and permits the transmission of comparatively great forces or moments while at the same time having a relatively small construction and power requirement.

Also disclosed in WO 2012/034697 A1 is a rotary button or operating button in which the actual button is attached so as to be rotatable about a shaft. The braking moment can be controlled by the magnetic field of an electric coil. Should a higher generatable braking moment be required, cylindrical rollers instead of spherical rotating members can also be used so that the magnetic field acts on a longer distance or larger area. It has been demonstrated, in particular in the case of rotary or operating buttons having a relatively small diameter, that an increase in length of the rolling members does not necessarily lead to an increase in the maximally generatable braking moment. It has been demonstrated that the cause therefor lies in that the magnetic field is closed by the central shaft, or has to pass through the latter. The small diameter of the shaft restricts the generatable braking moment, because the magnetic field required for the braking action is rapidly saturated in the (shaft) material. The material passed through by the magnetic field does not permit any higher magnetic flux, which is why a more intense magnetic field cannot make its way to the rollers either. The smallest cross section passed through by the magnetic field in the entire magnetic circuit defines the maximally possible magnetic flux and thus the maximum braking moment in the brake apparatus. The use of longer rollers as rotating members in this instance can even have a negative effect on the generatable braking moment because the magnetic field is distributed across the longer roller area. A lower field strength (per unit area of transmission) bears on said roller area. As the achievable braking effect is not a linear function of the magnetic field but disproportionally increases in the case of more intense magnetic fields, the achievable braking effect accordingly drops disproportionally in the case of weaker magnetic fields.

SUMMARY OF THE INVENTION

It is therefore the object of the present invention to provide a device component having a magnetorheological brake device, which permits a high braking moment (torque) or a higher braking moment (torque) than is the case in the prior art in particular also in the case of small or even in the case of very small diameters.

This object is achieved by a device component having a magnetorheological brake device having the features of claim 1. Preferred refinements of the invention are the subject matter of the dependent claims. Further advantages and features of the device component having a magnetorheological brake device are derived from the general description and from the description of the exemplary embodiments.

A device component according to the invention having a magnetorheological brake device has a stationary mount and at least two brake components. A first brake component is connected in a rotationally fixed manner to the mount and extends in an axial direction. The second brake component comprises a rotating part which is rotatable about the first brake component and is configured to be hollow (and in particular cylindrical inside). An encircling gap (effective gap) is configured between the first and the second brake component. The gap is at least partially filled with a magnetorheological medium. The magnetorheological medium here wets the first and the second brake component. The first brake component comprises a core which is made from a magnetically conductive material and extends in the axial direction, and (at least) one electric coil which in the axial direction is wound about the core and defines a coil plane so that a magnetic field of the electric coil extends transversely (to the axial direction) through the first brake component.

A maximum (external) diameter of the electric coil in a radial direction within the coil plane here is advantageously larger than a minimum (external) diameter of the core in a radial direction transverse (and in particular approximately perpendicular or perpendicular) to the coil plane. In particular, the maximum (external) diameter of the electric coil in a radial direction is larger than a maximum (external) diameter of the core in a radial direction transverse (and in particular approximately perpendicular or perpendicular) to the coil plane.

The maximum external diameter of the coil in a radial direction is advantageously larger than a diameter of a main body of the core. The maximum external diameter of the coil in a radial direction is advantageously larger than a diameter of a main body of the core in a radial direction transverse to the coil plane.

The main body is preferably configured to be cylindrical or at least in portions substantially cylindrical, elliptic or at least in portions arcuate or curved.

The main body is particularly preferably configured to be cylindrical. Magnetic field concentrators can in particular be configured on the main body. Shaped elements can in particular be configured and/or comprised on the main body. The shaped elements can advantageously comprise grooves, clearances and/or the like.

The main body in regions can have at least one flattened face and in particular two opposite (parallel) flattened faces. The flattened face can advantageously be configured so as to be substantially flat. The coil can be wound on the flattened face or faces.

The first brake component defines an axial direction. However, the first brake component, at least locally, can also be configured so as to be angled in relation to the axial direction. The wording that the core of the first brake component extends in the axial direction in the context of the present invention is understood to mean that the core at least substantially also extends in the axial direction. The core can have a profile which is preferably aligned so as to be parallel to the axial direction, or else can have a slight angle in relation to the axial direction. For example, the core can also be aligned at an angle of 2.5° or 5° or 10° or 15° in relation to the axial direction. Likewise, the winding of the electric coil does not have to be aligned exactly in the axial direction about the core. The electric coil can also be wound about the core at an angle of 5° or 10° or 15° or the like in relation to the axial direction. In all cases, however, it is preferable that an angle between the alignment of the core and the axial direction and an angle of the winding of the electric coil in relation to the axial direction is less than 20° and in particular less than 10°. The device component according to the invention having at least one magnetorheological brake device has many advantages. A significant advantage of the magnetorheological brake device according to the invention lies in that the electric coil is provided on the first brake component. A particular advantage is derived in that the electric coil in the axial direction is wound about at least a substantial part of the core or entirely about the core. A larger core diameter can be implemented in that a maximum external diameter of the electric coil in a radial direction within the coil plane can be larger than a minimum external diameter of the core in a radial direction transverse and in particular at least approximately perpendicular to the coil plane. A larger core cross section enables a more intense magnetic field to be generated (higher field strengths in the effective gap). As a result, higher braking forces can be generated at the same installation space or else identical brake forces can be generated at a smaller installation space; the achievable torque per unit of installation space thus increases. When required, it is also possible to generate still considerable braking forces in a very small installation space.

This is a result of the magnetic field of the electric coil running transversely to the axial direction of the first brake component (thus radially in relation to the longitudinal axis) and of the diameter of the electric coil being increased.

This is a significant difference to the prior art disclosed in WO 2012/034697 A1, in which the electric coil is provided on the external component and wherein the windings of the electric coil extend concentrically about the axial direction. As a result, a magnetic field which extends in the axial direction through the interior of the two components is generated in the prior art. The inner component, in most instances a thin shaft for reasons of construction, thus restricts the magnetic flux cross section in the prior art, and thus the overall magnetic flux to be maximally achieved. In contrast, the magnetic field or the magnetic field lines here runs/run transversely thereto and thus transversely through the first, or inner, brake component. An increase in the length of the first brake component here increases the potential magnetic flux and thus the braking moment, while maintaining the same diameter. The core diameter which usually for reasons of construction (related to the installation space) cannot be larger thus no longer restricts the magnetic flux. The winding(s) of the electric coil in the present invention preferably lie(s) (at least substantially) in a plane, or closely adjacent to the plane, which includes the central axis of the axial direction. In contrast, the central axis in WO 2012/034697 A1 lies so as to be perpendicular to the plane of the windings of the electric coil.

The invention is also very advantageous in comparison to the prior art of WO 2019/138015 A1, which shows a magnetorheological brake device having an electric coil wound about a longitudinal axis. As opposed thereto, the magnetic field in the core can be enlarged, and the braking force can thus also be increased and/or the installation space can be reduced. In this prior art, rolling members are disposed on the entire circumference and can roll around the latter. It is surprising that an amplification of the braking force can be achieved by a construction in which a complete revolution of the rolling members is no longer possible because the electric coil projects toward the outside.

This is achieved in that the available installation space is used in a favorable manner and in particular to the best extent possible. The objective is to generate an ideally high field strength (many amperes/meters) in the effective gap between the mutually moving effective faces (i.e. between rotating and stationary components). In order for this to be possible, specific magnetic cross sections are required in the components passed through by the magnetic field (magnetic circuit), said components in turn having to be supplied by an electric coil having a matching winding window and electrical design (wire thickness/wire diameter, number of wrappings/windings). All this has to be disposed within an installation space which in most instances is predefined (and often tightly dimensioned). Experiments in the prior art have demonstrated that a brake unit which is completely populated with rollers, for example, results in a lower braking moment than a partially populated brake unit, because the magnetic field generated by the electric coil and the magnetic field generated across the geometrically restricted core in the case of a completely populated brake unit are distributed across a plurality of transmission elements, as a result of which less field strength per transmission unit is obtained. Less field strength leads disproportionally to less braking moment. In the inventive construction, the MRF brake was not embodied with magnetically non-conducting rollers (the latter are placeholders, so to speak) but the space for these components which do not generate torque has been utilized for the enlargement of the electric coil and of the core so that more magnetic field is generated. This results in an increase in the braking moment in the same installation space, because the field strength in the effective gap is increased as a result. The installation space has been utilized to the best possible extent.

The device component is advantageously configured as a haptic operating device. The device component is particularly suitable for operating a haptic operating device. The device component is particularly preferably able to be used and/or suitable for operating a haptic operating device.

In the magnetorheological brake device the transmission components are at least partially surrounded by a magnetorheological medium. Overall, a magnetorheological fluid is preferably used as the magnetorheological medium.

A plurality of, in particular rotatable, transmission components are preferably disposed so as to be distributed across the circumference of the gap. The transmission components can be rotatable in the gap and in this instance preferably at least partially rotate during a rotation of the first and the second brake component relative to one another.

A central component part of the rotatable transmission component or the rotatable transmission component overall is in particular dimensionally stable and the external shape (at least substantially) does not change during a rotation. The rotatable transmission component preferably rotates at least somewhat during a rotation of the second brake component relative to the first brake component.

In one preferred refinement at least one transmission component is configured as a rolling member. The term "rolling member" in the context of the present invention is to be understood to be a rotating member which is suitable to roll in the gap on the first or the second brake component.

At least one rolling member preferably has a cylindrical or spherical or round or radiused (substantially dimensionally stable) cross section. In particular, a rolling member can have an (elongate) cylindrical portion. The rolling member at the ends can be radiused, or designed so as to taper in a point, or be angular. Other portions, and in particular end portions, are also possible. Cylindrical rollers are particularly preferably used as rolling members. A cylindrical rolling member has the significant advantage that the rolling member can be effective across the length of the cylindrical portion. The efficacy is increased as a result.

A significant advantage of the present invention lies in that a higher braking moment is able to be generated by increasing the length of a, for example cylindrical, rolling member. Simultaneously with the increase in the length of the rolling member, the electric coil can also be increased in length (in an expedient manner), said electric coil extending in the longitudinal direction of the first brake component. A larger passage area for the magnetic field (cross-sectional area passed through by the magnetic field) is made available by way of an electric coil which is configured so as to be longer in the axial direction. Therefore, in the present invention, an increase in the length of the first brake component in the axial direction also has the effect of an enlargement of the cross section of the core. As a result, a higher braking moment can be achieved by increasing the length of the first brake component in the axial direction.

In preferred design embodiments at least one part of the transmission components is composed of a magnetically conductive material. It is possible for a part of the transmission components to be composed of a magnetically non-conductive material. The plurality of the transmission components are preferably composed of a magnetically conductive material. In all cases, the magnetic field is concentrated in the region of the magnetically conductive transmission components. This leads to the concentration of the magnetic field and to a local amplification (magnetic field line concentration). Because the correlation between the generatable braking moment and the intensity of the magnetic field is not linear, and because the generatable braking moment becomes even disproportionally more intense as the magnetic field intensifies, a significant amplification of the generatable braking moment can be achieved as a result (at the same installation space/dimensions).

The iron particles are drawn in the direction of the magnetic field gradient (the force on magnetizable particles always acts in the direction of the more intense magnetic field). As a result, the concentration of the carbonyl iron particles is also increased in the regions with a higher magnetic field line concentration. For example, the magnetic field strength in the gap is increased by <350 A/m up to 1000 A/m or more as a result. The high (concentrated) field strength attracts more carbonyl iron particles from the magnetorheological liquid, this resulting in a carbonyl iron accumulation (clustering). This in turn permits higher shear stresses and thus braking moments to be generated.

In all design embodiments it is not necessary for the generatable braking moment to be increased in order to increase the diameter of the first brake component. This is very important because many potential applications do not permit a larger external diameter of a brake device, or a larger external diameter would be a severe competitive disadvantage (for example, an excessively large lateral adjustment wheel on a wristwatch). In order for the braking moment to be amplified/increased, the first brake component can be configured so as to be axially longer, which in terms of installation space is not a disadvantage, or is a lesser disadvantage.

The rotating part (in the axial direction) at least in portions preferably has a cylindrical internal surface.

On at least one angular segment of the external circumference of the core, at least one transmission component is preferably disposed between the core and the cylindrical internal surface of the rotating part. On the angular segment the core has in particular at least one receptacle that is adapted to the shape of the transmission components. In the case of cylindrically configured roller-shaped transmission components, the core in the region of the receptacle is preferably configured so as to be correspondingly concave. Only a minor gap is preferably configured between the receptacle and the transmission component. As a result, the transmission component is encompassed by the receptacle, and a particularly effective transmission of the magnetic field to the transmission component takes place.

In other design embodiments, or with the exception of the regions of the receptacles, the external surface of the core above the angular segment is preferably configured to be cylindrical.

The electric coil is in particular received on the core outside the angular segment. The electric coil particularly preferably radially protrudes farther outward than the external surface of the core in the angular segment.

In all design embodiments, at least two angular segments on which transmission components are disposed are preferably configured, wherein at least one angular segment, and preferably each angular segment, is in particular smaller than 150°.

In advantageous design embodiments, transmission components are disposed only in the angular segment or in the (in particular two) angular segments.

In advantageous refinements, a smaller radial gap size between the (radially outer ends of the) transmission components and the cylindrical internal surface of the rotating part is configured than a radial spacing between the coil and the cylindrical internal surface of the rotating part. A gap having a minor gap height (effective gap) is preferably present at the radially outer ends of the transmission components. In combination with high field strengths, an advantageous wedge effect can be adjusted as a result.

In preferred design embodiments, the core is fixedly connected to a plurality of transmission components. In this instance it is possible that no transmission component is rotatable. However, it is also possible for individual transmission components to be fixedly connected to the core, and for other transmission components to be provided as separate parts which can optionally also move or rotate in relation to the core. Said separate parts can be guided so as to be laterally rotatable.

The transmission components fixedly connected to the core can be configured integrally with the core or be fixedly connected to the latter and, for example, can be screwed or riveted or welded thereto.

At least some transmission components (fixedly connected to the core) preferably form outwardly projecting arms of the core.

It has been surprisingly demonstrated that particularly intense interlinking of the magnetorheological particles in the magnetorheological medium can also be generated without (rotating) rolling members. Effective interlinking and accumulating of carbonyl iron particles can be achieved using an intense magnetic field and high field strengths in the effective gap. In all cases, the transmission components serve as magnetic field concentrators. Transmission components can also be referred to as magnetic field concentrators. A particularly high field strength, and thus also particularly intense interlinking and accumulating of particles, is implemented as a result of the high field concentration in the region of the transmission components. The wedge effect amplifies the effect, because the gap does not have in an encircling manner a constant height but tapers.

The radial gap height is reduced in the region of the transmission components, while regions adjacent thereto can be interlinked and can form a type of lump/cluster.

Should higher braking moments than in the prior art be required in the given installation space with at the same time (very) low production costs, the axial width of the magnetic field concentrator (=a radial continuation of the core) can be embodied as very small and as a circular segment (closed contour). For reasons of production costs, the rollers or star-shaped contour, or similarly designed radially or axially projecting arms with intervening spaces, can be dispensed with here. The specially chosen (very) small width and special contour of the magnetic field concentrator here also concentrate the magnetic field and, as described above, lead to intense field strengths in the (annular) gap and thus to the concentration of carbonyl particles (clustering). While the field strengths in the effective gap, on account of the larger transition area, are not as high as in the case of individual arms, said field strengths are adequate for many applications, particularly because there is an intense cost pressure or there are other reasons.

In all design embodiments it is preferable for the first brake component to be received so as to be axially slidable or displaceable on the second brake component.

Preferably comprised is at least one sensor device, wherein the sensor device comprises at least one magnetic ring unit and at least one magnetic field sensor which for detecting a magnetic field of the magnetic ring unit is connected in a rotationally fixed manner to the first brake component and disposed so as to be radially and/or axially adjacent to the magnetic ring unit. At least one Hall sensor is in particular used. A two-dimensional or three-dimensional Hall sensor is advantageous, or two or more such Hall sensors are present.

The magnetic ring unit is in particular fastened to the rotating part.

In all refinements it is preferable for at least one shielding device for at least partially shielding the sensor device from a magnetic field of the electric coil and/or other components and/or any other external magnetic field to be comprised.

The shielding device comprises in particular at least one shielding member that at least in portions surrounds the magnetic ring unit. The shielding device preferably comprises at least one separation unit disposed between the shielding member and the magnetic ring unit, and/or at least one mounting device disposed between the shielding member and the rotating part. The mounting device preferably comprises a magnetic decoupling device, or is configured as the latter.

The mounting device connects in particular the shielding device to the rotating part. The shielding device and the rotating part are preferably coupled in a rotationally fixed manner. The shielding member can be fixedly connected to the mounting device. The shielding member and the mounting device can be integrally configured, however are preferably composed of different materials.

The separation unit, and preferably also the decoupling device, have in particular a magnetic conductivity which is less by a multiple than the shielding member. As a result, a particularly advantageous shielding of potentially interfering magnetic fields is effected. The shielding member, potentially configured in multiple parts, here is composed of such a magnetically conductive material and has such a wall thickness that no magnetic saturation arises in at least one wall, or in the walls, of the shielding member during normal operation. Effective shielding is guaranteed as a result, and a high quality of the measurement signal can be achieved.

The shielding device can be configured in multiple parts and comprise a plurality of components that are connected to one another. The shielding device comprises in particular at least one annular sleeve and at least one axial annular disk or, for example, two axial annular disks, wherein in this instance one axial annular disk can be disposed on each end.

The shielding device, or the (actual) shielding member of the shielding device, can also be configured in two parts and have two pot-shaped or cup-shaped elements, or one pot-shaped and one disk-shaped element (each having a central through bore), said elements conjointly defining a shielding volume in the interior.

In particular, the sensor device is disposed so as to be radially centric and approximately axially centric on the shielding device (defining a cylindrical volumetric portion). A position which is slightly axially off-center may be advantageous when an axial position is derived by way of an intensity of the measured magnetic field.

In particularly advantageous design embodiments, the shielding device and the magnetic ring unit are disposed so as to be mutually spaced apart (in the radial and the axial direction). For example, a separation unit made from a magnetically non-conducting material, or an only slightly conductive material, can be provided between the shielding member and the magnetic ring unit. The separation unit can be composed of a plastics material, for example. For example, the separation unit can be composed of an injection-molded part. The separation unit preferably ensures a defined spacing and defined positioning.

It is preferable for a closed (and externally sealed) chamber to be configured between the two brake components. The second brake component (approximately) at a first end of the closed chamber is preferably rotatably received or else mounted (at a first bearing point) on the first brake component. The closed chamber is particularly preferably substantially, and in particular completely, filled with the magnetorheological medium.

The second brake component is preferably received so as to be axially displaceable on the first brake component and, for example mounted, so that a volume of the closed chamber is varied by a mutual relative axial displacement of the two brake components, so as to make available a compensation for temperature-related volumetric variations.

The second brake component at a second end of the chamber is in particular received so as to be displaceable on the first brake component (and can be separately mounted thereon), wherein a diameter of the first bearing point at the first end of the closed chamber differs from a diameter of the second bearing point at the second end of the closed chamber.

In all design embodiments it is preferable for the rotating part to be configured on a rotary button or a rotating wheel. The rotating part can preferably be formed so as to be integral to a rotary button or a rotating wheel, for example. In such design embodiments it is preferable for the rotary button, or the rotating part, to be configured so as to be "pot"-shaped. The "lid" of the rotating part can be integrally connected to a rotating part configured as a sleeve part, or be separately fastened thereto.

The rotating part is preferably composed of a magnetically conducting material, or comprises a magnetically conducting sleeve part and makes available an external ring for the magnetic field. The magnetic field for generating a braking moment passes through the first brake component transversely to the axial direction and passes through the gap on the transmission elements which are configured so as to be magnetically conducting. From the stationary or movable transmission elements, or the rotatable rolling members, the magnetic field enters the external ring of the rotating part or the sleeve part. The magnetic field lines thereon run back to the other side of the first brake component and (on the opposite side) pass through the gap on the transmission elements or rolling members again, before the magnetic field lines enter the first brake component again. In this way, a closed magnetic circuit is present, or closed magnetic field lines are present.

Under the influence of a magnetic field during a relative rotation of the first and the second brake component relative to one another, a wedge effect is configured on the rolling members, such as is described in principle in WO 2012/034697 A1. The disclosure of this publication is completely incorporated in this application. In the present invention, the braking moment is likewise generated as a result of the wedge effect on the stationary or movable transmission components or rolling members or rotating members. It has been surprisingly demonstrated that rolling members are not always required. This is in particular very advantageous in the case of device components of a particularly small construction.

At least one radial wall thickness of the sleeve part, or the rotating part, is preferably at least half the size of a gap width of the gap and/or a diameter of a transmission component. A radial wall thickness (of the sleeve part) of the rotating part is preferably larger than ¾ of the gap width of the gap and/or of a diameter of a transmission component. The radial wall thickness (of the sleeve part) of the rotating part can in particular also be larger than a diameter of a transmission component. As a result of a sufficient wall thickness of the rotating part, which is composed of a magnetically conductive material, or of the sleeve part of the rotating part, it can be guaranteed that the desired field strength of the magnetic field can be generated in the region of the rolling members so as to be able to generate a high braking moment.

In all design embodiments it is preferable for a length of the first brake component in the axial direction to be larger than a length of a transmission component in the axial direction. When the transmission component in the axial direction is configured so as to be shorter than the first brake component, this leads to a three-dimensional concentration of the magnetic field in the peripheral region of the transmission component or of the rolling member. The magnetic field can practically pass through the gap only in those portions in which a transmission component or a rolling member is situated.

A length of the gap in the axial direction is preferably at least double the size of a length of a transmission component in the axial direction. It is also possible and preferable for two or more transmission components, and in particular rolling members, to be disposed successively in the axial direction. For example, it is possible here for magnetically conducting transmission components and magnetically non-conducting transmission components to alternate in the axial direction, so that every second or third transmission component in the axial direction is configured so as not to be magnetically conducting, for example. As a result, a concentration of the magnetic field is generated (intense field strengths in the effective gap at the magnetically conducting transmission components), this being advantageous for the maximally generatable braking moment.

The first brake component is preferably configured to be substantially cylindrical and comprises a cylindrical main body as the core, and the electric coil, or the electric coils. However, shapes deviating therefrom (elliptic . . . ) can also be chosen.

It is also possible for a sphere for mounting a rotary button or the brake device of the device component to be comprised, for example, said sphere potentially being disposed centrally at the distal end so as to make available a simple mounting between the first brake component and the second brake component.

It is possible for the electric coil to be at least partially wound in axial grooves and/or transverse grooves of the cylindrical main body (of the first brake component). The windings of the electric coil, or the entire component, are preferably cast so as to be embedded in a casting compound. It is preferable for potentially present axial grooves and/or transverse grooves to be at least partially filled with casting compound. It is prevented as a result that magnetorheological medium, or magnetorheological fluid, enters the region of the coil wires. This could lead to a decomposition of the fluid.

The mount preferably has a cable conduit. Connector cables for the coil and/or sensor cables and the like can be routed more through the mount, or through the cable conduit of the mount. Easy assembling and a cost-effective production are enabled as a result.

The mount preferably has a receptacle for the rotationally fixed connection to the first brake component. The mount here can receive in a force-fitting and/or form-fitting manner the first brake component. During operation, the braking moment between the first brake component and the second brake component is discharged by way of the mount.

The mount preferably has a cylindrical running face for a bearing and supports the rotating part so as to be rotatable on the mount.

A seal for sealing the gap is preferably disposed on the cylindrical running face, wherein the seal is in particular disposed closer to the gap than the bearing. As a result, the bearing is reliably protected from the magnetorheological medium. Such a design embodiment enables a compact construction and a reliable operation. The bearing can be, for example, a friction bearing or a rolling bearing.

The cylindrical running face is preferably hardened and/or has a higher surface quality than the radially outer surface of the receptacle. Production costs can be reduced as a result.

In advantageous design embodiments the cylindrical running face has an external diameter which is smaller than an external diameter of the receptacle of the mount by at least 3 mm.

The mount can be fastened to a console, or else to other parts.

A relative angular position or else an absolute angular position is preferably able to be detected. An accuracy is preferably better than 1° and in particular better than 0.5° and particularly preferably better than 0.2° or 0.1°.

A user interface, an operating panel, a display, a touch-sensitive display with or without haptic feedback and/or at least one sensor are/is preferably attached. Such a design embodiment, in addition to the operation, also simultaneously enables the display or output of information during the operation. In this way, an operating button with a simultaneous display of an output is made possible, for example.

In all design embodiments it is possible for a pressure-sensitive sensor to be attached to the mount, or for the mount to be assigned such a sensor. For example, a pressure-sensitive sensor can be attached in the mount. However, it is also possible for a piezo sensor to be attached to the lower part, etc. The mount can also be configured in two parts and register a mutual axial displacement of the two parts. Haptic feedback can take place in the process.

In all design embodiments it is preferable for a difference between an available internal diameter (of the sleeve part) of the rotating part and a minimum external diameter of the first brake component to be more than 1 or 2 or 3 mm and less than 50 mm. It is likewise preferable for an external diameter of the (sleeve part) rotating part to be between 5 mm or 10 mm and 90 mm. A height of the rotating part is preferably between 5 mm and 100 mm. In all design embodiments it is preferable that a control device is comprised, said control device being configured to initiate a variable braking effect by way of the electric coil.

Overall, the present invention particularly preferably operates according to the fundamental principle of wedge-action clamping, wherein a transmission component slides along the walls at a specific spacing, or optionally rolls on said walls. The wedge effect is created by a magnetic field, so that a high braking moment is able to be generated. As opposed to the prior art to date, in which a coil which is wound radially about the axis of a brake component generates a magnetic field in the axial direction of the brake component, according to the present invention a magnetic field is generated transversely to (the core) of the first brake component. As a result of the radially enlarged electric coil, higher braking moments can be generated here with a smaller installation size. Better scaling capability can be achieved by using this axial coil. As a result, by means of longer rolling members and an axially longer electric coil, it becomes possible to generate a scalable and higher braking moment. The diameter of the first brake component here does not have to be chosen to be larger in order to direct a corresponding magnetic field through said diameter, because the area of the core (cross-sectional area) also becomes larger as the core increases axially in length. Optionally, the axial length can also be reduced when only a relatively minor braking moment is required. The installation space can be accordingly adapted.

A further advantage lies in that the electrical connector cable for the electric coil can be readily routed out, even for large production volumes. Leak-tightness of the magnetorheological brake device, and scaling, can be made possible by simple means.

In principle, a greater moment can be generated by the magnetorheological brake device across comparatively long rolling members, because the effective length increases. It is guaranteed as a result of the yet again significantly larger core area that the transmission components are always exposed to a corresponding magnetic flux density. The magnetic field strength at the "wedge" on the transmission component can be chosen to be higher than in the prior art. Transmission components of a long configuration can be used, the latter being able to be supplied a sufficiently intense magnetic field.

The magnetic field generated by the electric coil runs in particular radially through the core, then through the rolling members, and is closed by way of the (sleeve part or) the rotating part or the external cylinder. The magnetic field lines here close once in the one and, for example, lower or left half, and once in the other and, for example, upper or right half, of the rotating part. The distances are thus short, this consequently leading to an improved response time (lower inductivity). In simple design embodiments the magnetic flux thus runs so as to be substantially two-dimensional. It is irrelevant here how long or high the transmission components are configured. As a result, arbitrary scaling in the length can be achieved because the magnetic field transmission area increases conjointly with the former. In contrast, in the case of electric coils which are wound concentrically about the longitudinal direction of the first brake component (prior art) the cross-sectional area in the core always remains identical and to this extent forms a bottleneck for the magnetic field as long as the diameter is not changed. A larger diameter of the first brake component however also changes the required installation space, the installation dimensions and the weight of the magnetorheological brake device. Moreover, the moment intervals and the rotating speeds of the rolling members change, this not always being advantageous. However, there is no change when the available core cross section is enlarged and a linear increase in length takes place as in the present invention.

When longer rolling members are used, the braking effect of a long roller can be better than in the case of two short rollers of the same overall length. The reason lies, inter alia, in that the liquid has to be displaced over a longer distance because the periphery is farther away (hydrodynamic pressure).

In preferred design embodiments, the magnetorheological brake device has a diameter (of the sleeve part) of the rotating part of between approximately 5 and 40 mm (+/−20%), in preferred design embodiments approximately 10 to 20 mm.

In all design embodiments it is possible for the electric coil in the axial direction to be configured longer than the transmission components. A concentration of the magnetic field on the transmission components is achieved as a result.

Overall, the invention makes available an advantageous device component having a magnetorheological brake device ("MRF brake"). The external diameter of the MRF brake here is in most instances specified, in particular in the case of haptic applications. In this regard, there are ergonomic guidelines or installation space specifications. Therefore, the core cross section generally cannot be increased so easily, because, with this, the external diameter also becomes larger (button external diameter; surface for the fingers). Furthermore, with increasing external diameter, a greater blocking moment is again required, because the moment spacing therefore became larger. (The finger force, that is to say the (tangential) force between the actuating finger(s) and the brake element or the outer surface of the brake element, must or should remain the same because, on the one hand, the user can only impart a certain force, and the required forces at the fingers (fingertips) are important for physical comfort during the activation (operator control quality)). The invention increases the effective core cross section.

The electrical coil (electric coil) extends only axially and extends in the radial direction further to the outside. The magnetic field generated by the coil passes radially through the core, then through the rolling members and is closed via the outer cylinder (in each case through the opposite halves). This always remains the same irrespective of how high (or long) the rolling members or the MRF brake are or is.

The invention achieves the aim of obtaining an MRF brake which is as simple as possible but nevertheless easily scalable and which has a high braking moment whilst having a compact external diameter.

The axial electric coil which is wound (in the axial direction) about the core and is cast generates a magnetic field. This closes by way of the rolling members and the rotating part, the latter forming an external cylinder, as has been described above. Casting the electric coil is advantageous so that the MR liquid (carrier liquid) does not make its way into the whitespaces between the coil wires (capillary effect). This may otherwise lead to the decomposition. A flat material made of copper or any other suitable material can also be used instead of a (cylindrical) coil wire.

The core, the rolling members and the external cylinder can be made from a simple steel (for example S235), without high requirements in terms of the surface characteristic and hardness, said steel preferably having good magnetic properties. However, (a plurality of stacked) rolling members or balls, or transmission components of another shape, can also be used. Spacers (baffles) can be present between the rolling members.

The space (gap) still available beside the electric coil, between the core and the external cylinder, does not mandatorily have to be (almost) completely filled with rolling members. Spacers between the rolling members, or one or a plurality of rolling members or transmission component made of magnetically non-conducting material, conjointly with rolling members or transmission component made of magnetically conducting material, can also be used.

The core, including the electric coil and the casting compound, are preferably centered in a "mount" and fixed (force-fitting or form-fitting connection), and the counter torque by way of said "mount" can be dissipated, for example to a console, a base plate, a receptacle plate, a housing or another component. The mount preferably has a bore through which the cables are routed. A sealing element (for example an O-ring) preferably seals the cable in relation to the mount or the interior space, so that no liquid from the interior space can make its way to the outside by way of the cable. In addition to the (coil) cable, a temperature sensor cable or another sensor cable can also be routed through this opening. The cylindrical surface of the tapered mount is preferably finished in such a manner that said cylindrical surface has running properties (a higher surface hardness and a minor surface roughness, coated or hardened or annealed in a similar manner).

The mount can also be produced from a material that is different from that of the core, the rolling member of the external cylinder. The reduction in the diameter of the mount on the running face has the advantage that the frictional radius for the sealing element is decreased, this reducing the overall friction. Moreover, due to the resulting increased construction height, a bearing element which has a bearing external diameter that is identical to the internal diameter of the rotating part can be used. This reduces the production costs of the rotating part; no production-related shoulder (undercut) is required. The preferred rolling member height is between 3 mm and 6 mm, but may also be 1 mm or 2 mm. It is difficult in this range to obtain good bearings or sealing elements, unless the internal diameter of the mount additionally achieves installation height.

When the mount is composed of a different material than the core, for example of a plastics material, it is advantageous to fit or press-fit a sleeve of metal on the mount in the region of the sealing element (O-ring), so that the sealing element does not damage or even destroy the mount as a result of friction.

A decorative or other transmission element, for example a rubberized button or a friction wheel or a special knurled wheel, or the like, can be fitted over the external cylinder.

A ball or a ball-shaped or ball-like component (may also be a hemisphere) can preferably be on one end between the external cylinder and the casting compound. Said ball guides the two parts relative to one another. The ball is preferably fixed in the casting compound, and the inner axial end side of the external cylinder rotates relative thereto. A simple, low-friction and cost-effective mounting (bearing point) is achieved in this way. A conical shape or the like is also possible. However, any other type of mounting (for example a friction mounting or a rolling mounting) can also be chosen instead of this type of mounting.

At least one component that is passed through by the magnetic field is preferably at least partially or completely composed of the material FeSi3P. Magnetic field strengths of more than 350 A/m are particularly preferably able to be generated in the effective gap, or magnetic field strengths of more than 350 A/m can be generated in the effective gap.

At least one magnetorheological brake device is preferably controlled, as described above.

Another device component serves for generating an in particular high magnetic field strength between a stationary (in particular first brake component) and a component (in particular second brake component) moving relative thereto in an in particular restricted construction volume, said device component having an electric coil, a core wrapped by the electric coil, and having transmission elements, wherein the electric coil and the core in the cross section utilize almost the entire internal diameter, and the transmission elements are attached laterally thereto. Preferably, the second brake component completely surrounds the first brake component. A maximum diameter of the electric coil in a cross section is preferably so large that the transmission elements have to be disposed laterally beside the electric coil. The applicant reserves the right to claim a method for generating a high magnetic field strength.

Further advantages and features of the present invention are derived from the exemplary embodiments which are explained hereunder with reference to the appended figures.

BRIEF DESCRIPTION OF THE FIGURES

FIGS. 6a-6d show another device component having a magnetorheological brake device;

FIG. 6e shows a schematic illustration of a profile of a sensor signal; and

DETAILED DESCRIPTION OF THE INVENTION

FIGS. 1a to 1f show a plurality of device components 200 according to the invention, in which the magnetorheological brake device 1 can be used. The device components 200 are in each case embodied as a haptic operating device 100.

Figure 1A:
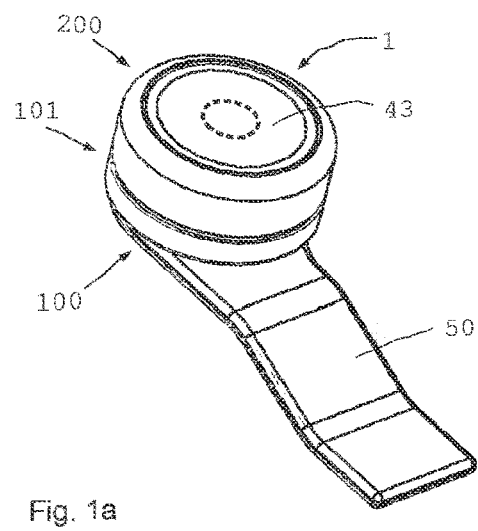
FIGS. 1a-1f show schematic three-dimensional views of device components according to the invention having a magnetorheological brake device.

FIG. 1a shows a haptic operating button 101. The operating button 101 is fastened by way of the console 50. The operating button 101 is operated by way of the sleeve part 13e. The user interface 43 can additionally be used to transmit information.

Figure 1B:
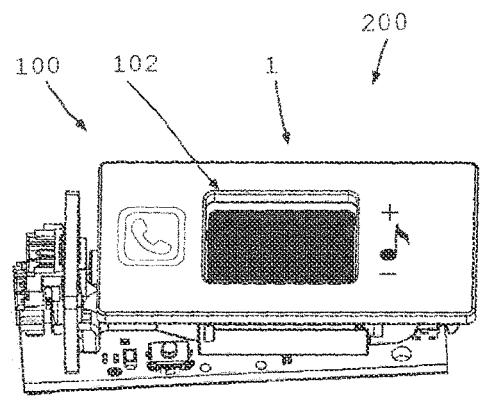

The device component 200 in FIG. 1b is illustrated as a thumb wheel 102 having a haptic operating device 100. The thumb wheel 102 is preferably able to be used in steering wheels, for example. However, the thumb wheel is not limited to this specific application. The thumb wheel 102, depending on the installation situation, can generally also be able to be utilized using any other finger.

Figure 1C:
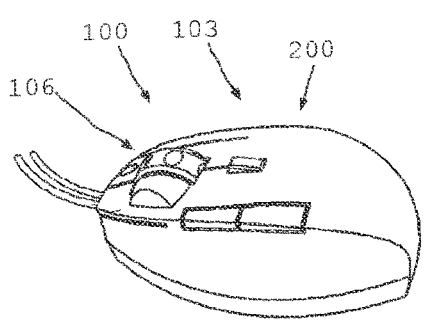
Figure 1D:
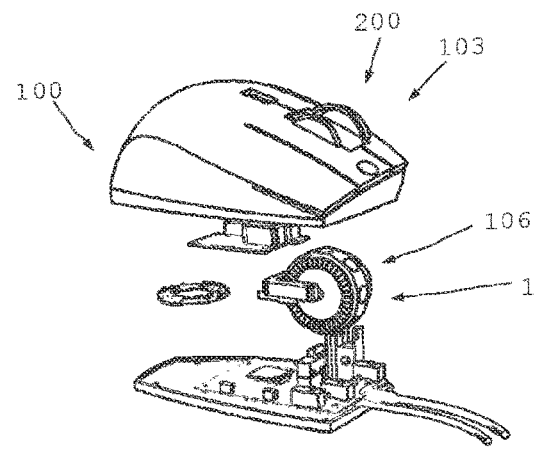

The device component 200 according to the invention in FIG. 1c and FIG. 1d is embodied as a computer mouse 103. The haptic operating device 100 is disposed in the mouse wheel 106. The magnetorheological brake device 1 can be utilized in order to control haptic feedback.

Figure 1E:
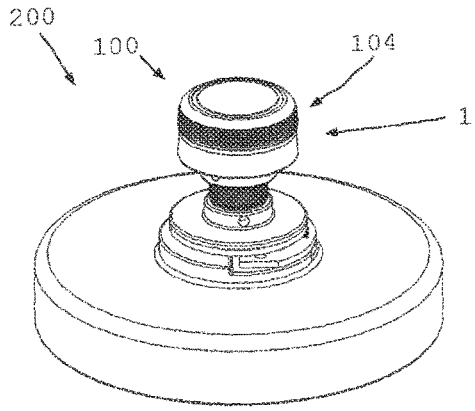
Figure 1F:
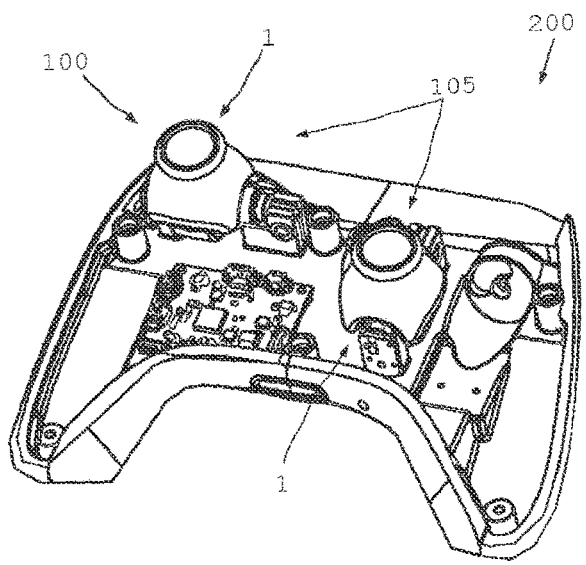

FIG. 1e shows a joystick 104 as a haptic operating device 100 in which a magnetorheological brake device 1 is disposed. Moreover, the magnetorheological brake device 100 according to the invention is preferably also able to be used in a game pad 105 so as to provide haptic feedback to the player as a function of the game situation, cf. FIG. 1f.

In these exemplary embodiments the magnetorheological brake device 1 has a rotating part 13, or sleeve part 13e, which is rotatably received. The torque required for rotating the rotating part 13 is adjustable.

A user interface 43 can be disposed on the upper side of the magnetorheological brake device 1. For example, such a user interface 43 can be configured as a display device or else as a touch-sensitive input possibility (touchpad, control by movement and gestures, image recognition . . . ).

A haptic operating device 100 can be used, for example, for operating machines, medical equipment, or be used in and for the motor vehicle. The use of other equipment or other devices is also possible.

Figure 2:
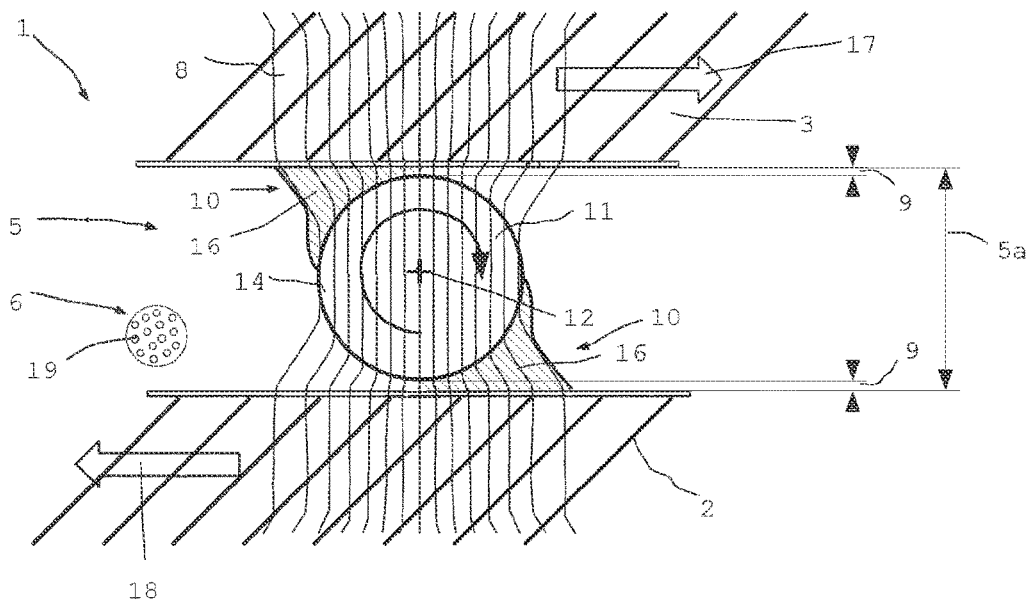
FIG. 2 shows a highly schematic cross section through a rolling member of a magnetorheological brake device.

FIG. 2 shows a highly schematic cross-sectional view of a magnetorheological brake device 1 according to the invention for influencing the transmission of force between two brake components 2 and 3. A rolling member 11, or a rotating member 11, is provided here between the two brake components 2 and 3 in FIG. 2. The rolling member 11 here is configured as a ball 14. However, it is likewise possible for rolling members 11 to be configured as cylinders or ellipsoids, rollers or other rotatable rotating members 11. Rotating members which are not rotationally symmetrical in the true sense, such as a gear wheel, or rotating members 11 having a specific surface structure, can also be used as rolling members. The rolling members 11 are not used for mutual mounting but for the transmission of torque.

A duct 5 which here is filled with a medium 6 is provided between the brake components 2 and 3. The medium here is a magnetorheological fluid which as a carrier liquid comprises an oil, for example, in which ferromagnetic particles 19 are present. Glycol, grease, water and viscous substances can also be used as a carrier medium, the latter not being limited thereto. The carrier medium may also be gaseous, or the carrier medium may be dispensed with (vacuum). In this case, only particles which are able to be influenced by the magnetic field 8 are filled into the duct.

The ferromagnetic particles 19 are preferably carbonyl iron powder, wherein the distribution of size of the particles 19 is a function of the specific application. Specifically preferable is a distribution of the particle size between one and ten micrometers, wherein larger particles 19 of twenty, thirty, forty and fifty micrometers are alternatively possible. Depending on the specific application, the particle size may also become considerably larger and even venture into the millimeter range (particle spheres). The particles can also have a special coating/casing (titanium coating, ceramic casing, carbon casing, etc.) in order for said particles to better withstand the high compressive loads which may arise depending on the specific application. The magnetorheological particles 19 for this specific application cannot only be produced from carbonyl iron powder (pure iron) but also from special iron (harder steel), for example.

The rolling member 11 is preferably set in rotation about the rotation axis 12 thereof by the relative movement 17 of the two brake components 2 and 3 and practically rolls on the surface of the brake component 3. At the same time, the rolling member 11 runs on the surface of the other brake component 2 such that a relative speed 18 prevails there.

More specifically, the rolling member 11 has no direct contact with the surface of the brake components 2 and/or 3 and, therefore, does not roll directly on the latter. The available spacing 9 of the rolling member 11 from one of the surfaces of the brake components 2 or 3 is, for example, 140 µm. In a specific design embodiment having particle sizes between 1 µm and 10 µm, the available spacing 9 is in particular between 75 µm and 300 µm, and particularly preferably between 100 µm and 200 µm.

The available spacing 9 is in particular at least ten times the diameter of a typical mean particle diameter. The available spacing 9 preferably has at least ten times a largest typical particle 19. As a result of direct contact being absent, there is a very minor basic friction/basic force/basic moment in the mutual relative movement of the brake components 2 and 3.

When the magnetorheological brake device 1 is impinged with a magnetic field 8, the field lines are configured as a function of the spacing between the rolling members 11 and the brake components 2, 3. The rolling member 11 is composed of a ferromagnetic material and here of ST 37 (S235), for example. The steel type ST 37 has a magnetic permeability μr of approximately 2000. The field lines (magnetic circuit) pass through the rolling member 11 and are concentrated in the rolling member. A high magnetic flux density in the duct 5 prevails on the entry face and the exit face of the field lines on the rolling member 11, said faces here being radial. The non-homogenous and intense field thereon leads to local and intense interlinking of the magnetically polarizable particles 19 (magnetic interlinking). The effect is very much increased as a result of the rotating movement of the rolling member 11 in the direction of the wedge 16 being formed in the magnetorheological fluid, and the potential braking or coupling moment is extremely increased, far beyond the value which is normally able to be generated in the magnetorheological fluid. The rolling member 11 and the brake components 2, 3 are at least in part preferably composed of ferromagnetic material, which is why the magnetic flux density increases as the available spacing 9 between the rotating member 11 and the brake components 2, 3 decreases. As a result, a substantially wedge-shaped region 16 is configured in the medium, in which the gradient of the magnetic field 8 heavily increases up to the acute angle at the contact point, or the region of the smallest available spacing 9.

Despite the spacing between the rolling member 11 and the brake components 2, 3, the rolling member 11 can be set in rotating motion as a result of the mutual relative speed of the surfaces. The rotating movement is possible with an effective magnetic field 8 and also in the absence of the latter.

When the magnetorheological brake device 1 is exposed to a magnetic field 8 of an electric coil 26, the latter not being illustrated in FIG. 2 here, the individual particles 19 of the magnetorheological fluid 6 interlink along the field lines of the magnetic field 8. It is to be noted that the vectors plotted in FIG. 2 illustrate the region of the field lines that is relevant for influencing the MRF only in a roughly schematic manner. The field lines enter the duct 5 so as to be substantially normal on the surfaces of the ferromagnetic components, and, above all in the acute region 10, do not have to run in a rectilinear manner.

At the same time, some material of the magnetorheological fluid 6 on the circumference of the rolling member 11 is conjointly set in rotation such that an acute region 10 is configured between the brake component 3 and the rolling member 11. On the other side, an identical acute region 10 is created between the rolling member 11 and the brake component 2. In the case of rolling members 11 of a cylindrical design, for example, the acute regions 10 may have a wedge shape 16. Due to the wedge shape 16, the further rotation of the rolling member 11 is impeded such that the effect of the magnetic field 8 on the magnetorheological fluid 6 is amplified, because the effective magnetic field 8 within the acute region 10 results in a stronger cohesion of the medium 6 therein. As a result, the effect of the magnetorheological fluid 6 (the interlinking in the fluid and thus the cohesion or the viscosity) in the accumulated cluster is increased, this impeding the further rotation or movement of the rotating member 11.

As a result of the wedge shape 16 (particle clustering), substantially higher forces or moments can be transmitted than would be possible using a compatible construction that only utilizes the shear movement without a wedge effect.

The forces which can be transmitted directly by way of the applied magnetic field 8 represent only a small part of the forces that can be transmitted by way of the device. The wedge formation and thus the mechanical force reinforcement can be controlled by way of the magnetic field 8. The mechanical reinforcement of the magnetorheological effect can progress so far that a transmission of force is possible even after an applied magnetic field 8 is de-energized, if the particles 19 have been wedged.

It has been found that the wedge effect of the acute-angled regions 10 results in a significantly greater effect of a magnetic field 8 of a specific strength. In this case, the effect can be amplified by a multiple. In a specific case, the mutual relative speed of two brake components 2 and 3 was influenced approximately ten times as much as in the prior art in the case of MRF clutches based on the shear principle in which a magnetorheological fluid 6 is disposed between two mutually moving faces and is exposed to the shear forces of the mutually moving faces. The possible amplification here by way of the wedge effect depends on different factors. It can possibly also be intensified by a greater surface roughness of the rolling members 11. It is also possible for outwardly protruding projections to be provided on the external surface of the rolling members 11, which projections may result in an even stronger wedge formation.

The wedge effect is distributed in a two-dimensional manner between the rolling member 11 and the components 2 or 3.

Figure 3:
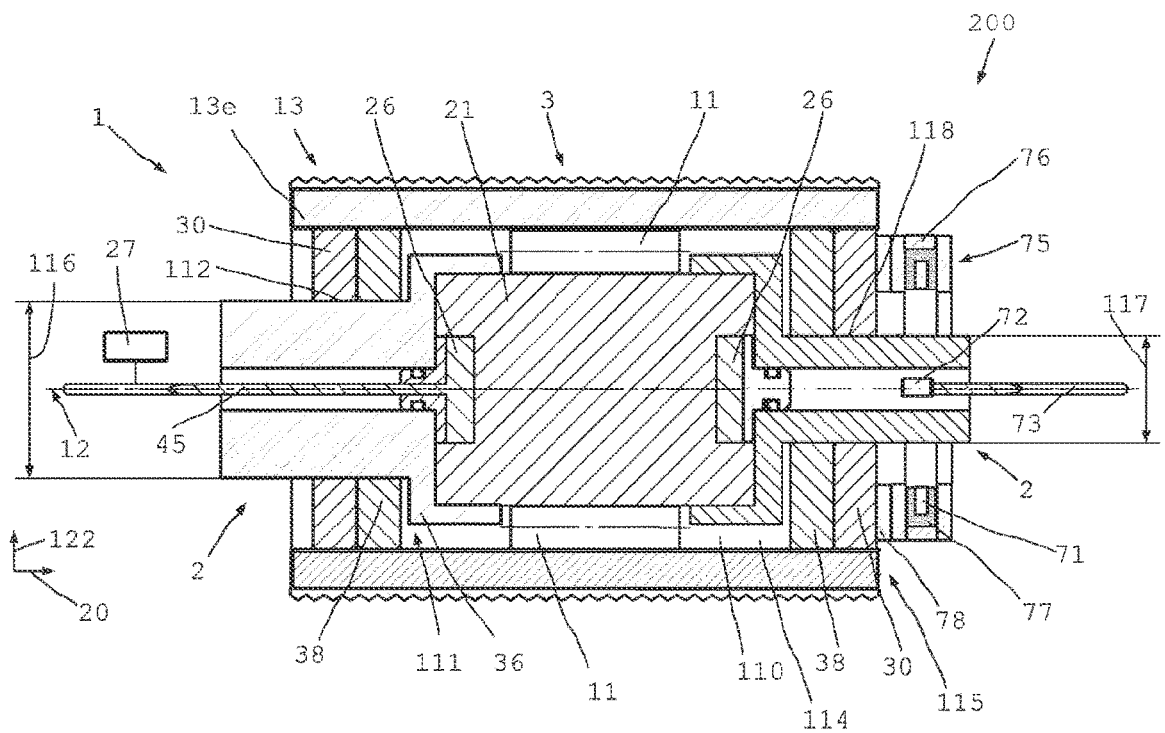
FIG. 3 shows a schematic cross section through a device component according to the invention having a magnetorheological brake device.

FIG. 3 shows a section through a device component 200 having a magnetorheological brake device 1 which possesses two brake components 2 and 3. The first brake component 2 and the second brake component 3 extend substantially in an axial direction 20. The first brake component 2 here is disposed in the interior of the second brake component 3 and by a mount 4 is held in a form-fitting and/or force-fitting manner. The mount 4 can be fastened to an external console, for example, or to an apparatus. The mount 4 is regularly fastened in a rotationally fixed manner. The second brake component 3 is received so as to be continuously rotatable relative to the first brake component 2 on the latter.

The second brake component 3 is of an elongate configuration and possesses the rotating part 13 and therein a magnetically conductive sleeve part 13e.

The second brake component 3 is rotatably received on the first bearing point 112 and on the second bearing point 118 on the second brake component 2, and is in particular mounted so as to be axially displaceable. At the bearing points 112, 118, forces in a global radial direction 122 can be supported by the mountings 30, while the first brake component 2 is axially displaceable relative to the second brake component 3. The diameter 116 of the first bearing point 112 here is approximately double the size of the diameter 117 of the second bearing point 118.

The second brake component 3 is routed out at both ends. A closed chamber 110 which is filled with MRF is configured between the brake components 2 and 3. In the region of the first end 111 of the chamber 110 a cylindrical running face on the mount 4 is configured as the first bearing point 112. Present there is a hardened surface or a surface having a corresponding surface finish. A bearing 30 for rotatably mounting the second brake component 3 is attached to this cylindrical running face 37. A seal 38 is provided further inward in the axial direction 20 adjacent to the bearing 30. The seal 38 reliably seals the interior.

The first brake component 2 has a main body 33. The windings of an electric coil 26 are wound about the core 21. The individual windings of the electric coil 26 here project outward beyond the cylindrical main body 33 (cf. FIG. 5).

A gap 5, which here is embodied substantially as a hollow-cylindrical gap 5, exists radially between the external wall of the first brake component 2 and the inner wall of the sleeve part 13. A plurality of transmission components 11, which here are configured as rolling members 11, are disposed in the gap 5. The rolling members 11 here are configured as cylindrical rolling members 11 and have an external diameter which is somewhat smaller than the gap width of the gap 5. Furthermore, the gap 5 here is filled with a magnetorheological medium 6.

An O-ring, or the like, which is filled with air or any other gas which makes available volumetric compensation in the event of temperature variations can be disposed in a region of the gap, for example. Moreover, a reservoir is formed as a result, should magnetorheological fluid 6, or medium 6, leak from the interior to the outside in the course of the operation. The construction here is utilized so as to, as a result of the dissimilarly sized diameters 116, 117, make available automatic temperature compensation and a reservoir for MRF.

The (utilizable) gap length of the gap 5 here is larger than the length of the rolling members 11. The electric coil 6 in the axial direction 20 here is also configured so as to be longer than the length of the rolling members 11.

The core 21 can be seen in the interior of the electric coil 26. The mount 4 has a radially enlarged receptacle 36 (diameter 36a, cf. FIG. 4) for receiving the first brake component 2 in a rotationally fixed manner. A cable conduit 35 extends through the mount 4 downward through the mount 4. Cables 45 for connecting the electric coil 26 and optionally sensor lines 73 are routed out there. A control device 27 can be provided or assigned in the foot of the mount 4, or at other suitable locations, so as to perform appropriate controlling.

A closed chamber 110 is configured between the first end 111 and the second end 115. The closed chamber 110 comprises the volume 114 which is filled substantially completely with the magnetorheological medium 6.

A variation of the volume of the magnetorheological medium 6 here, by virtue of the dissimilar diameters 116, 117 of the two bearing points 112, 118, leads to a relative axial displacement of the first brake component 2 in relation to the second brake component 3.

In the case of the first brake component 2 being stationary, the second brake component 3 in the event of a volumetric increase is displaced to the right in the orientation of FIG. 3. A small part of the first brake component 2, having the diameter 116, exits the closed chamber 110 at the first bearing point 112, whereas a part of the first brake component 2 at the second end 115, having the considerably smaller diameter, enters the closed chamber 110. In this way, the volume 114 of the closed chamber 110 is ultimately increased. A volumetric variation of the magnetorheological medium 6, caused by an increase in temperature, can thus be compensated for in particular. A function of the magnetic field generator device 113 is not influenced in the process. In the event of a volumetric reduction, which may arise due to temperature, or else due to leakage, the second brake component 3 here is displaced to the left.

In practical terms, ambient pressure prevails at all times during the displacement within the magnetorheological brake component 1. Above all, any additional stressing of the seals 38 is prevented in this way. In the case of a compensation device based on a gas bubble, however, the interior space is always pressurized, this resulting in more leakage and higher friction as a result of the enhanced sealing required.

Moreover, the magnetorheological brake device 1 possesses a sensor device 70, at least for detecting a mutual relative angular position of the two brake components 2, 3. The detection is performed using a magnetic ring unit 71 and by means of a magnetic field sensor 72. The sensor device 70 here is connected to the second brake component 3 by way of a decoupling device 78. The decoupling device 78 magnetically decouples the sensor device 70. The sensor device 70 here furthermore comprises a shielding device 75 which here comprises a plurality of shielding members 76 and which surrounds the magnetic ring unit 71 on three sides. A separation unit 77 is present between the magnetic ring unit 71 and the shielding device 75. The separation unit 77 additionally shields the magnetic ring unit 71. As a result, the volume defined by the magnetic ring unit 71 is largely shielded from magnetic influences of the electric coil 26 or other magnetic fields.

Figure 4:
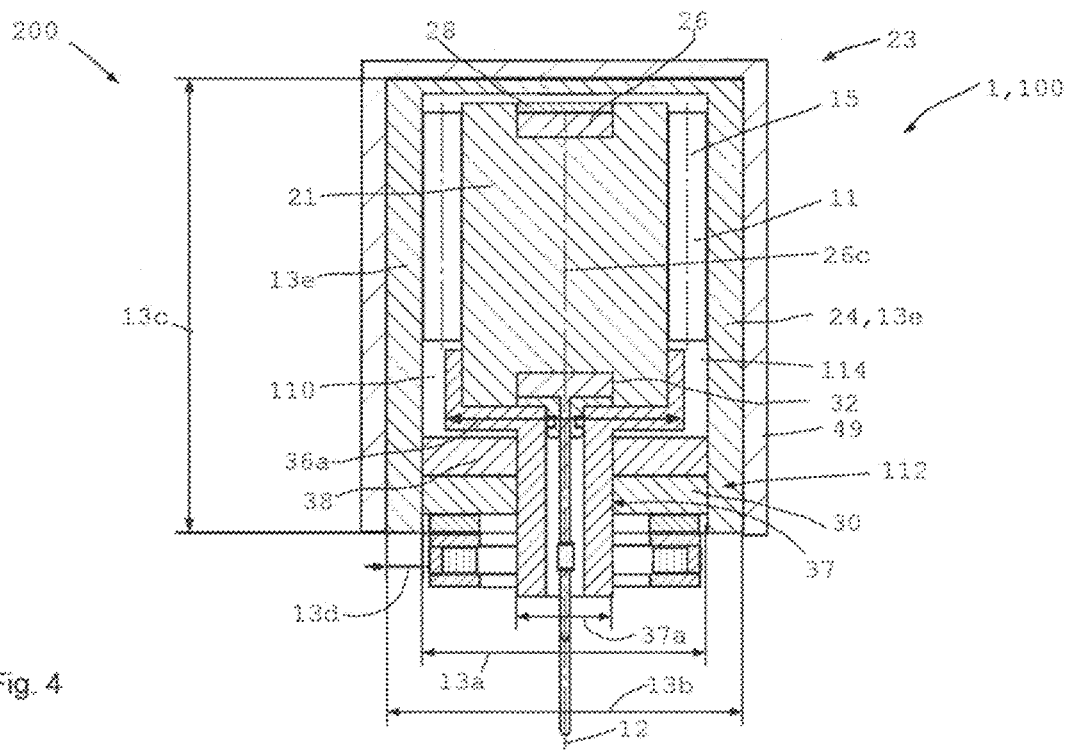
FIG. 4 shows a cross section of a further device component having a magnetorheological brake device.

FIG. 4 shows another device component 200 in a sectional view, having a similar magnetorheological brake device 1. The transverse grooves 32 in which the electric coil 26 is wound at the axial ends of the core 21 can be seen. A casting compound 28 is provided in each case in the axial direction 20 for closure on both ends. A separate seal 38, for example by way of the plotted O-ring, or the like, is provided in the region of the cable conduit 35.

It is also possible for some of the rolling members 11 that are disposed so as to be distributed across part of the circumference to be configured as magnetically non-conductive transmission components 11. All rolling members 11 are preferably made of a magnetically conducting material such as, for example, steel.

A length or height 13c of the rotating part 13 and of the sleeve part 13e, or of the second brake component 3, in the axial direction 20 is preferably between 5 mm and 90 mm. A covering 49 can be applied to the outside on the second brake component 3 so that the external appearance of the rotary button 23 is substantially determined by the surface of the covering 49.

The material of the sleeve part 13e or of the rotating part 13 is overall magnetically conducting and serves for closing the magnetic circuit. A wall thickness 13d of the sleeve part 13e is preferably at least half the size of a diameter of the rolling members 11.

The diameter 36a of the receptacle 36 is preferably significantly larger than the diameter 37a of the cylindrical running face 37. As a result, the friction on the seal 38 is reduced. Moreover, standardized bearings 30 can be used.

It is also possible for the core 21 and also the mount 4 to be embodied in two parts. The separation preferably runs along the central line plotted in FIG. 4, this resulting in a left and a right (core) half. The two core halves can be mutually spaced apart by a magnetically non-conducting element (for example seal). The casting compound volume 28 in this instance is preferably part of the core half (halves), this resulting in a semicircular element having an encircling groove on the separation face for the electric coil 26. Furthermore preferably, the receptacle 36 is also divided into two halves. One receptacle half, conjointly with one core half, may also form one part (be integrally configured), or one core half, conjointly with a complete receptacle unit 36, may be integrally embodied.

The haptic operating device 100 having the magnetorheological brake device 1 here is unilaterally mounted. The second brake component 3 here is received only at the first end of the closed chamber 110, on an end portion 121 of the first brake component 2, that is to say that the second brake component 3 is mounted only by the mounting 30 at the first bearing point 112. In the event of a variation of the volume 114 within the closed chamber 110, the second brake component 3 can easily move back and forth. It is again assumed here that the first brake component 2 is stationary. In this case, part of the diameter 116 of the first brake component 2 moves in or out at the first bearing point 112. The volume 114 of the closed chamber 110 changes. Advantageously, the system within the freedom of movement provided is practically always at ambient pressure. Any additional stressing of the seal 38 is prevented.

FIGS. 5a to 5d show various schematic cross sections of the magnetorheological brake device 1, said cross sections being able to be used in the device components 200 as per FIGS. 3 and 4, and also in other exemplary embodiments.

The inner brake component 2 is configured to be stationary, and is surrounded by the continuously rotatable brake component 3. The second brake component 3 has a rotating part 13 which is rotatable about the first brake component 2 and is configured so as to be hollow and cylindrical on the inside. The encircling gap 5 between the first and the second brake component 2, 3 can be clearly seen. The gap 5 here is at least partially, and in particular completely, filled with a magnetorheological medium 6.

The first brake component 2 has the core 21, which extends in the axial direction 20 and is made of a magnetically conductive material, and an electric coil 26 which in the axial direction 20 is wound about the core 21 and defines a coil plane 26c. The magnetic field 8 of the electric coil 26, transversely to the axial direction 20, extends through the first brake component 2, or the core 21. The core 21 here has a cylindrical main body 33 which on the upper side and the lower side is flattened transversely to the coil plane 26c. The windings of the coil are received thereon.

It can be clearly seen that a maximum external diameter 26a of the electric coil 26 in a radial direction 26d within the coil plane 26c is larger than a minimum external diameter 21b of the core 21 in a radial direction 25 transverse, and for example perpendicular, to the coil plane 26c. Moreover, the minimum external diameter 21b of the core 21 transverse to the coil plane here likewise corresponds to the maximum external diameter 21c and to the diameter 21d of the cylindrical main body 33 of the core 21.

The maximum external diameter 26a of the electric coil 26 in a radial direction 26d within the (central) coil plane 26c is larger than the diameter 21d of the cylindrical main body 33 of the core 21.

The rolling members 11 are in each case disposed only in angular segments 61, 62 and cannot rotate completely about the core 21, because the electric coil 26 in a radially outward manner protrudes beyond the main body 33 of the core 21 into the gap 5, or duct 5, and thus prevents a complete revolution.

As a result, there is less available space for the rolling members 11. However, this leads to an even higher concentration of the magnetic field 8. By way of example, three magnetic field lines are plotted in FIG. 5a.

Figure 5A:
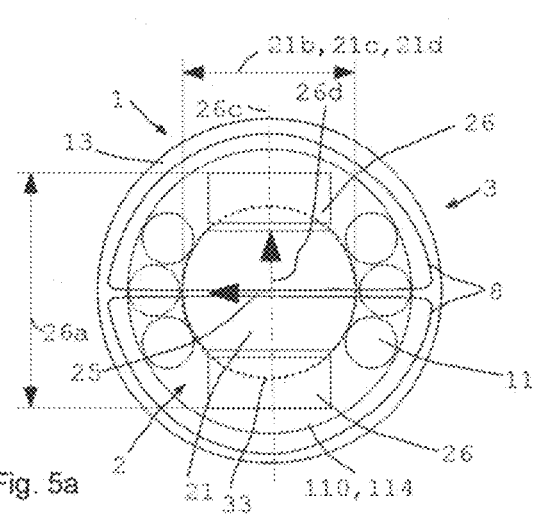
FIGS. 5a-5d show schematic cross sections of the device components having a magnetorheological brake device as per FIG. 3 or 4.
Figure 5B:
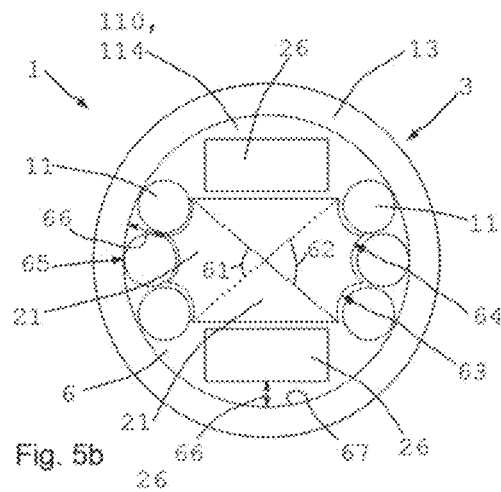

In FIG. 5b, the rolling members 11 are not received on a cylindrical external surface of the core 21 but on receptacles 63 which are specially adapted to the contour of the rolling members 11 and on which the rolling members 11 are received and guided, preferably with some play. The transition of the magnetic field 8 into the rolling members 11 is advantageously, because a large amount of transmission area is available between the core 21, or the external surface 64 on the receptacles 63, and the rolling members 11.

The electric coil is disposed outside the angular segments 61 and 62. No rolling members 11 are situated outside the angular segments 61 and 62. The core 21 here comprises a cylindrical main body 33 on which the receptacles for the magnetic field concentrators 11 are configured. The diameter 21d of the main body 33 here corresponds to the minimum core diameter 21b.

Also in the exemplary embodiment as per FIG. 5b the maximum external diameter 26a of the electric coil 26 (in a radial direction 26d) within the (central) coil plane 26c is larger than the diameter 21d of the smallest cylindrical envelope of the main body 33 of the core 21. As a result of the receptacles 63, the diameter of the smallest cylindrical envelope of the main body 33 is somewhat larger than the diameter of the core 21 in FIG. 5a. Nevertheless, the diameter of the smallest cylindrical envelope of the main body 33 is however smaller than the maximum coil diameter 26a. The maximum core diameter 21c here is also smaller than the maximum coil diameter 26a.

Figure 5C:
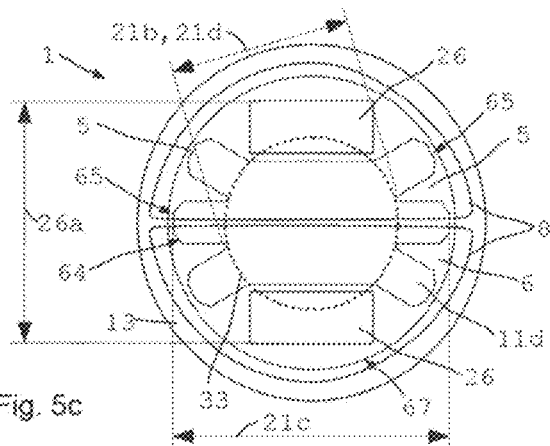
Figure 5D:
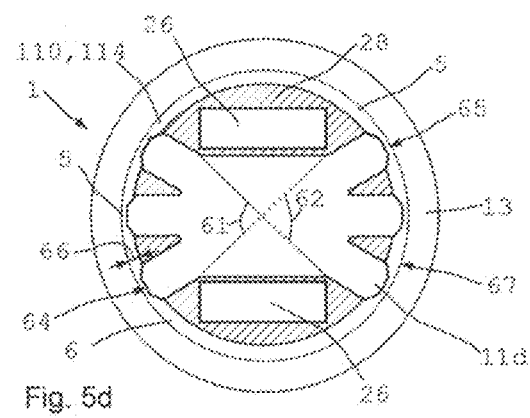

FIGS. 5c and 5d show refinements or design embodiments in which rolling members 11 are completely dispensed with. The cores 21 have outwardly projecting transmission components 11 which from the main body 33 extend radially outward. The chamber 110 between the core 21 and the rotating part 13 in FIG. 5c is completely filled with MRF. The rotating part 13 has a cylindrical internal surface 67.

The maximum external diameter 26a of the coil 26 is larger than the minimum core diameter 21b or the diameter of the main body 33. The radial extent of the gap 5 varies across the circumference. That is only a minor gap dimension 65 at the outer ends of the transmission components 11, while a radial spacing 66 between the brake component 2 and the brake component 3 at other locations is significantly larger.

FIG. 5d shows a variant of FIG. 5c in which the chamber 110 by way of a cylindrical portion is filled with a casting compound 28 in order for the MRF volume 114 to be reduced. As a result, the required volume of MRF drops. The radial spacing 66 is significantly decreased but remains significantly larger (at least by a factor of 2 or 3 or 5 or 10) than the radial gap dimension 65. It is ensured as a result that the wedge effect described arises. The MRF particles interlink in the acute regions and form a type of wedge 16, the latter leading to a significant braking moment. The transmission components 11 in FIGS. 5c and 5d form a type of radial arms 11d.

FIGS. 6a to 6e show a further embodiment of a device component 200 which here again possesses a magnetorheological brake device 1 and comprises brake components 2 and 3. A "lying or axial coil" is again used, in which the electric coil 26 in the axial direction 20 is wound about the core 21 and again has a maximum radial coil diameter 26a which is larger than a minimum core diameter 21b of the core 21 or than a diameter of the main body of the core. Here too, the rolling members 11 or transmission elements 1 are not disposed across the entire circumference.

The device component 200 here is embodied as a haptic operating device 100 and in detail embodied as an operating button 101. The second brake component 3 is received on the bearing point 112 at the first end 111 of the closed chamber 110. Moreover, the second brake component 3 is received on the second bearing point 118 on the first brake component 2. The mounting here is implemented by means of an axle stub 119 having the diameter 117 at the second bearing point 118. The annular seal 46 prevents the magnetorheological medium 6 flowing into the region behind the axial stub 119.

The diameter 117 at the second bearing point 118 here is embodied so as to be considerably smaller than the diameter 116 at the first bearing point 112. In this way, a volumetric variation in the event of an axial displacement is also enabled here. Temperature-related volumetric variations, and volumetric variations caused by leakages, can be compensated for. To this end, a relative axial displacement of the first brake component 2 in relation to the second brake component 3 takes place.

Moreover, a sensor device 70 for detecting an angular position of the haptic operating device 100 is also present here. The magnetic field sensor 72 is integrated in the stationary receptacle 4, or the first brake component 2. The cable 45 of the magnetic field sensor 72, that is to say the sensor line 73, at the receptacle 36 is routed outward through the cable conduit 35.

The first axle part 2, or the mount of the brake component 2, as illustrated in FIGS. 6b and 6c, can preferably be embodied in two parts. As a result, the assembling of the electrical lines and in particular of the sensor line 73 within the first brake component 2 is simplified above all. The cables can be installed through the open cable conduit 35.

The sensor device 70 is illustrated once again in detail in FIG. 6d. The first brake component 2 and the second brake component 3, the latter here being embodied as the rotating part, are only indicated (by dashed lines). The sensor device 70 is supported on the rotatable second brake component 3 so as to be magnetically decoupled by way of the decoupling device 78. The shielding device 75 here is composed of three shielding members 76 which mitigate the straying of the magnetic field 8 of the electric coil 26. Moreover, a separation unit 77 for the magnetic separation is also present. The magnetic ring unit 71 is utilized for measuring the orientation, or the rotation angle, of the magnetorheological brake device 1. The magnetic field sensor 72 is disposed within the first brake component 2. Moreover, small relative axial displacements can be utilized for detecting a depression of an operating button 101, for example, cf. FIG. 6e.

A push/pull function can also be integrated. The construction here is fundamentally as has already been described. A momentary contact switch can be activated and is automatically reset. In this instance, the diameters of the two bearing points 112, 118 are chosen so as to be identical in size. As a result, the volume within the chamber 110 does not change in the event of a relative axial displacement of the first brake component 2 in relation to the second brake component 3. A displacement of the first brake component 2 of the figures to the left, for example, leads to the spacing of the magnetic field sensor 72 from the magnetic ring unit 71 being enlarged or changed.

In addition to the magnetic field sensor 72, the sensor device 70 comprises a magnetic ring unit 71 and a shielding device 75 in order to minimize magnetic interference signals.

The received signal 68 according to the illustration of FIG. 6e changes as a result of an axial displacement. FIG. 6e shows the profile of the amplitude 69 of the signal 68 detected by the magnetic field sensor 72, illustrated as a function of the axial displacement of the brake components 2, 3 (horizontal axis). The amplitude 69 of the detected signal 68 varies as a result of an axial displacement of the magnetic field sensor 72 in relation to the magnetic ring unit 71. An axial displacement of an operating button 101, or depressing the latter, or a lateral displacement of a mouse wheel 106, for example, or of other components can be detected. The rotation angle can also be detected using the same magnetic field sensor 72, or sensor, wherein the direction of the magnetic field is determined in order for the rotation angle to be detected. The intensity determines the axial position. An activation of the momentary contact switch can therefore be concluded from a variation of the signal 68. This is advantageous because a single (multi-dimensional) Hall sensor can be used for determining the angular position and for determining an axial position.

Figure 7A:
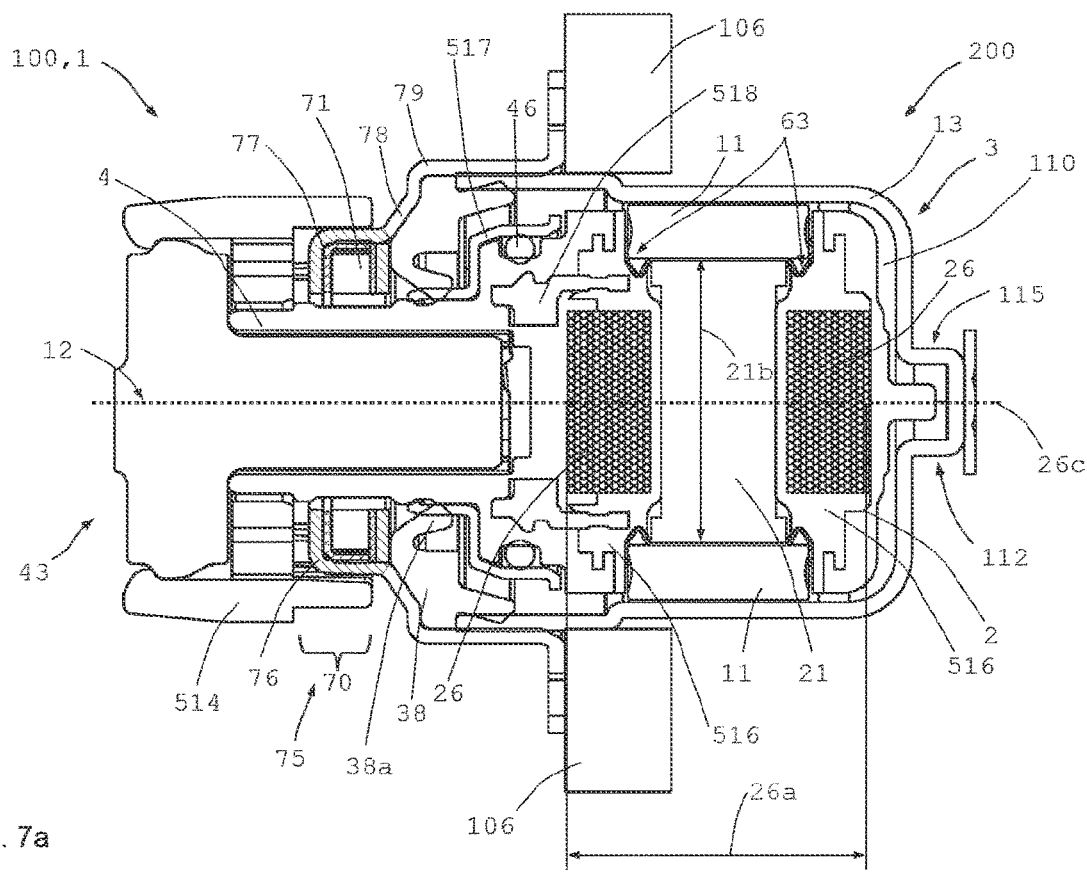
FIGS. 7a-c show a further device component having a magnetorheological brake device.
Figure 7B:
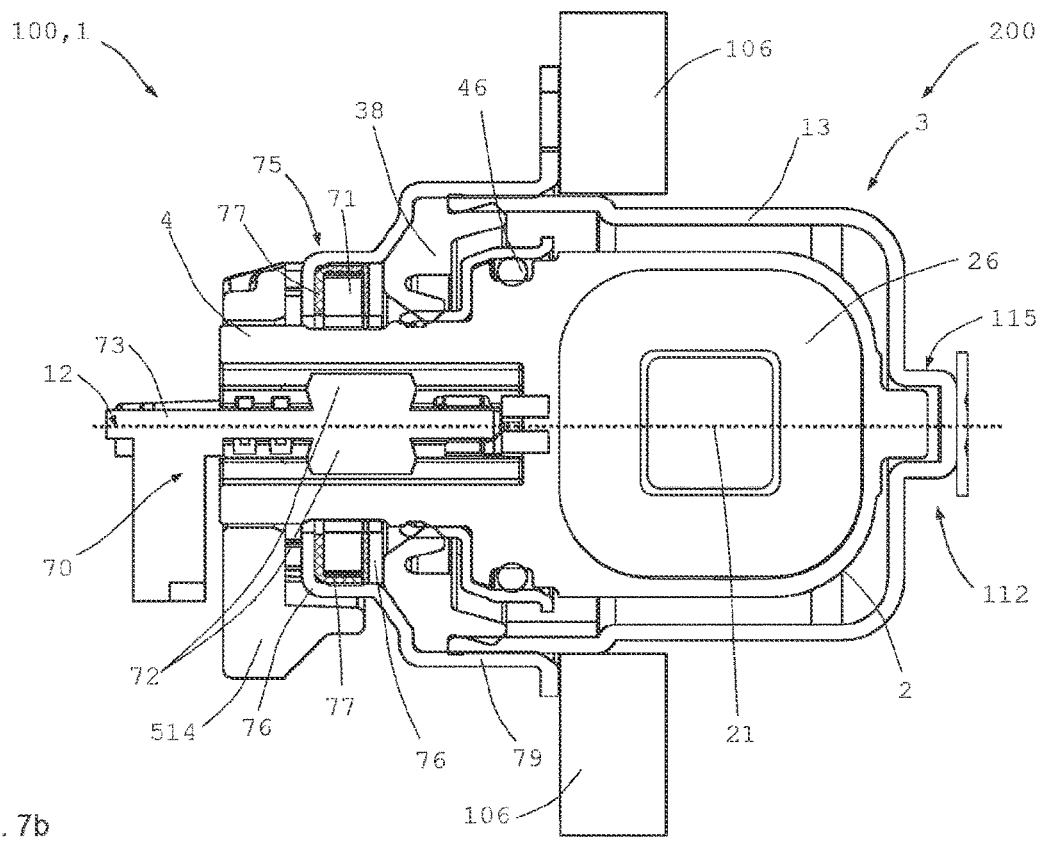
Figure 7C:
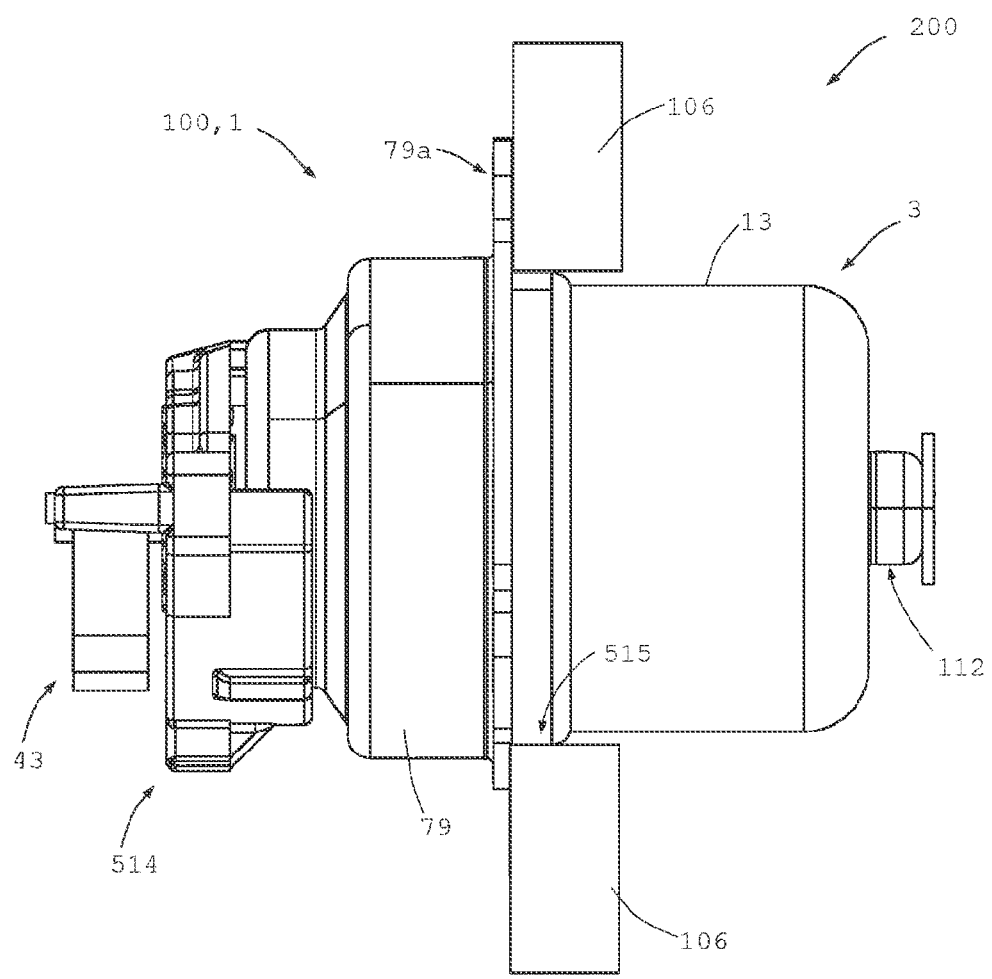

FIGS. 7a-c show a further embodiment of a device component 200 according to the invention having a haptic operating device 100 having a magnetorheological brake device 1, the latter here being configured for receiving a mouse wheel 106.

A sectional view along the coil plane 26c is illustrated in FIG. 7a. The device component 200 comprises a first brake component 2 and a second brake component 3.

The first brake component 2 comprises the stationary mount 4 on which the core 21 and the coil mount 516 are received. The coil mount 516 can be in two parts, for example. The mount 4 as well as the coil mount 516 are preferably substantially composed of a magnetically non-conductive material or an only slightly conductive material, and the core 21 is composed of a substantially positively or highly positively magnetically conductive material. A ratio of the magnetic conductivity of the core 21 and the mount 4 and/or the coil mount 516 is preferably more than 10 or 100 or 1000.

The power supply to the electric coil 26 takes place by way of the electrical connection 518 and by way of the user interface 43. The rolling members 11 here are rotatably received on the receptacles 63 on the coil mount 516.

The second brake component 3 comprises a rotating part 13 which here is rotatably received and mounted on the first brake component 2. The rotating part 13 is particularly preferably composed of a substantially positively or highly positively magnetically conductive material. Said material can be the same material as the material of the core. A ratio of the magnetic conductivity of the rotating part 13 and the magnetic conductivity of the mount and/or of the coil mount 516 is preferably also more than 10 or 100 or 1000.

A first (and outer) bearing point 112 is configured on the right on the outer end. A mounting device 79 is received on the rotating part 13. The mounting device 79 supports a shielding device 75, or is integrally configured with the latter. Shielding members 76 of the shielding device 75 are received or configured on the shielding device 75. A plurality of receptacles 79a (cf. FIG. 7c), on which the rotatable mouse wheel 106 is disposed and fastened here, are configured on the mounting device 79.

A seal 38, an annular seal 46 (for example an O-ring) and a sealing sleeve 517 (preferably made of metal) are provided here for sealing the closed chamber 110. The annular seal 46 is disposed directly on the mount 4 or the coil mount 516. The sealing sleeve 517 encompasses the annular seal 46. The seal 38 is provided between the sealing sleeve 517 and the mounting device 79. The seal lip 38a bears on the, in particular metallic, sealing sleeve 517 here. Particularly low friction is generated as a result of this inner sealing face, so that an advantageous operating comfort is provided here. The friction radius is small, as is the friction face.

The sensor device 70 is disposed in the region of the axially outer, and here left, end of the shielding member 76. The shielding device 75 (and also the separation unit 77) comprises the magnetic ring unit 71, in particular in a U-shaped or V-shaped manner, or the like, wherein the magnetic ring unit 71 is received in the interior of the shielding member 76. It is also possible for the magnetic ring unit 71 to be received in an L-shaped manner and to be axially shielded only in an outward manner, for example. In any case, at least one separation unit 77 is provided between the magnetic ring unit 71 and the shielding member 76 so as to magnetically separate the shielding member 76 from the magnetic ring unit 71.

A decoupling device 78 for magnetically decoupling the shielding device from the electric coil 26 is preferably comprised. The decoupling device 78 can be formed by the mounting device 79.

The mount 4 here is comprised by a separate shaft mount 514. The brake device 1 here is received and mounted on the shaft mount 514.

The electric coil 26 in the coil plane 26c here has a diameter 26a which is larger than the minimum diameter 21b of the core 21 transverse to the coil plane 26c. The diameter 26a is also larger than a diameter of the main body of the core 21.

The separation unit 77 in FIG. 7a is illustrated by cross-hatched lines, and the immediate region of the shielding member 76 surrounding the separation unit 77 is plotted by hatched lines. The magnetic ring unit 71 is received in the separation unit 77.

The device component 200 in FIG. 7b is illustrated in a sectional view through the coil plane 26c. The winding of the coil 26 about the core 21 can be clearly seen here. Moreover, the magnetic field sensors 72 above all can also be seen here.

FIG. 7c shows a lateral view of the device component 200. The mouse wheel 106 here is received on the rotating part 13 of the second brake component 3. A total of three receptacles 79a on which the mouse wheel 106 is received are configured on the mounting device 79. The receptacles 79a are disposed so as to be uniformly distributed across the circumference. Only one receptacle 79a is illustrated so as to be visible in the lateral view. The receptacles 79a can also be provided on a component which is separate from the mounting device 79.

To be seen on the left side are the shaft mount 514 and the user interface 43. An assembly shoulder 515 for receiving the mouse wheel 106 is provided on the rotating part 13.

Controlling can take place in a manner analog to that shown in WO 2017/001697 A1 in FIGS. 9a to 9c and explained in the associated general description and the description of the exemplary embodiments. The device component 200 here is used as a rotary button and a haptic operating aid. Controlling can also take place as is shown in FIGS. 11a to 11c of WO 2018/215350 A1 and described therein with reference thereto.

In all design embodiments, the preferably low-alloy steel can keep a residual magnetic field. The steel is preferably demagnetized regularly or when required (inter alia by a special alternating field).

The material FeSi3P (silicon steel), or a material of a related generic type, is preferably used for the components passed through by the magnetic field.

In all cases, voice or noise control can be performed. The braking device can be adaptively controlled using the voice control.

When the rotating unit is not being rotated, i.e. when the angle is constant, the current is preferably continuously reduced over time. The current can also be varied as a function of the speed (rotational angular speed of the rotating unit).

| List of Reference Signs: | |
|---|---|
| 1 | Magnetorheological brake device |
| 2 | Brake component, axle part |
| 3 | Brake component, rotating part |
| 4 | Mount |
| 5 | Gap, duct |
| 5a | Gap width |
| 6 | Medium, magnetorheological fluid |
| 8 | Field, magnetic field |
| 9 | Available spacing |
| 10 | Acute region |
| 11 | Transmission component, rolling member, rotating member |
| 11d | Arm |
| 12 | Rotation axis |
| 13 | Rotating part |
| 13a | Internal diameter |
| 13b | External diameter |
| 13c | Height |
| 13d | Wall thickness |
| 13e | Sleeve part |
| 14 | Ball |
| 15 | Cylinder |
| 16 | Wedge shape, wedge |
| 17 | Direction of the relative movement |
| 18 | Direction of the relative movement |
| 19 | Magnetic particles |
| 20 | Axial direction |
| 21 | Core |
| 21b | Minimum diameter of 21 |
| 21c | Maximum diameter of 21 |
| 21d | Diameter of 33 |
| 23 | Rotary button |
| 24 | External ring |
| 25 | Radial direction |
| 26 | Coil, electric coil |
| 26a | Maximum diameter |
| 26c | Coil plane |
| 26d | Radial direction to 26c |
| 27 | Control device |
| 28 | Casting compound |
| 30 | Bearing |
| 32 | Transverse groove |
| 33 | Main body |
| 35 | Cable conduit |
| 36 | Receptacle |
| 36a | External diameter |
| 37 | Cylindrical running surface |
| 37a | External diameter |
| 38 | Seal |
| 38a | Seal lip |
| 43 | User interface |
| 45 | Cable |
| 46 | Annular seal |
| 49 | Covering |
| 50 | Console |
| 61 | Angular segment |
| 62 | Angular segment |
| 63 | Receptacle for 11 |
| 64 | External surface |
| 65 | Radial gap dimension |
| 66 | Radial spacing |
| 67 | Internal surface of 13 |
| 68 | Signal |

-continued

List of Reference Signs:

| | |
|---|---|
| 69 | Amplitude |
| 70 | Sensor device |
| 71 | Magnetic ring unit |
| 72 | Magnetic field sensor |
| 73 | Sensor line |
| 74 | Momentary contact switch |
| 75 | Shielding device |
| 76 | Shielding member |
| 76a | Receptacle of 76 |
| 77 | Separation unit |
| 78 | Decoupling device |
| 79 | Mounting device |
| 100 | Haptic operating device |
| 101 | Operating button |
| 102 | Thumb wheel |
| 103 | Computer mouse |
| 104 | Joystick |
| 105 | Gamepad |
| 106 | Mouse wheel |
| 110 | Closed chamber |
| 111 | First end of 110 |
| 112 | First bearing point |
| 113 | Magnetic field generator device |
| 114 | Volume of 110 |
| 115 | Second end of the closed chamber |
| 116 | Diameter of the first bearing point |
| 117 | Diameter of the second bearing point |
| 118 | Second bearing point |
| 119 | Axle stub |
| 121 | End portion of 2 |
| 122 | Radial direction (global) |
| 200 | Device component |
| 514 | Shaft mount |
| 515 | Assembly shoulder |
| 516 | Coil mount |
| 517 | Sealing sleeve |
| 518 | Electrical connection |

The invention claimed is:

1. A device component, comprising:
a magnetorheological brake device having a stationary mount and at least two brake components, being a first brake component and a second brake component;
said first brake component being connected and rotationally fixed to said stationary mount and extending in an axial direction;
said second brake component including a hollow rotating part that is rotatable about said first brake component;
said first and second brake components being disposed to form an encircling gap therebetween;
a magnetorheological medium in said gap;
said first brake component including a core made from a magnetically conductive material and extending in the axial direction;
an electric coil wound in the axial direction about said core and defining a coil plane, defining a magnetic field generated by said electric coil to extend transversely through said first brake component;
said electric coil having a maximum exterior diameter in a radial direction within said coil plane that is greater than a minimum exterior diameter of said core in a radial direction transversely to said coil plane; and
one or a plurality of transmission components disposed in said gap; and
said transmission component being a rolling member having a cross section selected from the group consisting of cylindrical, spherical, round, and radiused.

2. The device component according to claim 1, wherein said transmission component is at least partly composed of a magnetically conductive material.

3. The device component according to claim 1, wherein a radial gap dimension between said transmission components and said cylindrical internal surface of said rotating part is smaller than a radial spacing between said coil and said cylindrical internal surface of said rotating part.

4. The device component according to claim 1, wherein said core is fixedly connected to a plurality of transmission components.

5. The device component according to claim 4, wherein least some of said transmission components form outwardly projecting arms.

6. The device component according to claim 1, wherein said first brake component displaceably mounted in the axial direction.

7. The device component according to claim 1, wherein said at least two brake components are disposed to form a closed chamber therebetween, wherein said second brake component at a first end of said closed chamber is rotatably received on said first brake component, and wherein said closed chamber is substantially filled with said magnetorheological medium.

8. The device component according to claim 1, wherein said rotating part carries a rotary button or a rotating wheel.

9. The device component according to claim 1, wherein said rotating part comprises a sleeve of a magnetically conducting material and provides an external ring for the magnetic field formed by said electric coil.

10. The device component according to claim 1, wherein said first brake component comprises said electric coil and a main body forming said core.

11. The device component according to claim 1, wherein said mount has a receptacle for a rotationally fixed connection to said first brake component, and wherein said mount is formed with a cylindrical running face for a bearing and supports said rotating part for rotation on said mount.

12. The device component according to claim 1, further comprising at least one user interface, an operating panel, a display, a touch-sensitive display with or without haptic feedback.

13. A device component, comprising:
a magnetorheological brake device having a stationary mount and at least two brake components, being a first brake component and a second brake component;
said first brake component being connected and rotationally fixed to said stationary mount and extending in an axial direction;
said second brake component including a hollow rotating part that is rotatable about said first brake component;
said first and second brake components being disposed to form an encircling gap therebetween;
a magnetorheological medium in said gap;
said first brake component including a core made from a magnetically conductive material and extending in the axial direction;
an electric coil wound in the axial direction about said core and defining a coil plane, defining a magnetic field generated by said electric coil to extend transversely through said first brake component;
said electric coil having a maximum exterior diameter in a radial direction within said coil plane that is greater than a minimum exterior diameter of said core in a radial direction transversely to said coil plane; and one or a plurality of transmission components disposed in said gap said rotating part having a cylindrical internal surface, and on at least one angular segment of an external circumference of said core at least one transmission component being disposed between said core and the cylindrical internal surface of said rotating part; and at least one receptacle disposed on the angular segment of said core and adapted to a shape of said transmission components.

14. The device component according to claim 13, wherein said external surface of said core above the angular segment is cylindrical.

15. The device component according to claim 13, wherein said electric coil is received on said core outside an angular segment thereof and radially protrudes farther outward than the external surface of said core in the angular segment.

16. The device component according to claim 13, which comprises at least two angular segments on which transmission components are disposed, with at least one of said angular segments being smaller than 150°.

17. The device component according to claim 13, further comprising transmission components disposed only in said angular segments.

18. A device component, comprising:

a magnetorheological brake device having a stationary mount and at least two brake components, being a first brake component and a second brake component;

said first brake component being connected and rotationally fixed to said stationary mount and extending in an axial direction;

said second brake component including a hollow rotating part that is rotatable about said first brake component;

said first and second brake components being disposed to form an encircling gap therebetween;

a magnetorheological medium in said gap;

said first brake component including a core made from a magnetically conductive material and extending in the axial direction;

an electric coil wound in the axial direction about said core and defining a coil plane, defining a magnetic field generated by said electric coil to extend transversely through said first brake component;

said electric coil having a maximum exterior diameter in a radial direction within said coil plane that is greater than a minimum exterior diameter of said core in a radial direction transversely to said coil plane;

a sensor device having at least one magnetic ring unit and at least one magnetic field sensor, said field sensor, for detecting a magnetic field of the magnetic ring unit, being connected in a rotationally fixed manner to said first brake component and being disposed radially and/or axially adjacent said magnetic ring unit; and a shielding device for shielding said sensor device from the magnetic field of said electric coil.

19. The device component according to claim 18, wherein said magnetic ring unit is fastened to said rotating part.

20. The device component according to claim 18, wherein said shielding device comprises a shielding member surrounding said magnetic ring unit at least in portions thereof, said shielding device comprises a separation unit disposed between said shielding member and said magnetic ring unit and/or at least one magnetic decoupling device disposed between said shielding member and said rotating part.

21. The device component according to claim 20, wherein said separation unit has a magnetic conductivity that is less by a multiple than said shielding member.

* * * * *